(12) United States Patent
Opreni et al.

(10) Patent No.: US 12,413,160 B2
(45) Date of Patent: Sep. 9, 2025

(54) LONG STROKE MEMS ACTUATOR RESILIENT TO THE PULL-IN AND ELECTRONIC SYSTEM INCLUDING THE SAME

(71) Applicant: STMICROELECTRONICS S.r.l., Agrate Brianza (IT)

(72) Inventors: Andrea Opreni, Terno d'Isola (IT); Valentina Zega, Porto Sant'Elpidio (IT); Attilio Frangi, Milan (IT); Gabriele Gattere, Castronno (IT); Manuel Riani, Como (IT)

(73) Assignee: STMICROELECTRONICS S.r.l., Agrate Brianza (IT)

( * ) Notice: Subject to any disclaimer, the term of this patent is extended or adjusted under 35 U.S.C. 154(b) by 135 days.

(21) Appl. No.: 18/161,740

(22) Filed: Jan. 30, 2023

(65) Prior Publication Data

US 2023/0253895 A1 Aug. 10, 2023

(30) Foreign Application Priority Data

Feb. 7, 2022 (IT) .......................... 102022000002150

(51) Int. Cl.
*H02N 1/00* (2006.01)
*B81B 3/00* (2006.01)

(52) U.S. Cl.
CPC ........... *H02N 1/008* (2013.01); *B81B 3/0021* (2013.01); *B81B 2201/033* (2013.01); *B81B 2203/0136* (2013.01); *B81B 2203/053* (2013.01)

(58) Field of Classification Search
None
See application file for complete search history.

(56) References Cited

U.S. PATENT DOCUMENTS

| 6,265,806 B1 * | 7/2001 | Suzuki ................... H02N 1/008 310/309 |
| 6,508,124 B1 | 1/2003 | Zerbini et al. |

(Continued)

FOREIGN PATENT DOCUMENTS

CN 101448646 A 6/2009

OTHER PUBLICATIONS

Ba-Tis et al., "A 3-DOF MEMS Electrostatic Piston-Tube Actuator," *Journal of Microelectromechanical Systems* 24(4):1-12, 2015.
(Continued)

*Primary Examiner* — Bernard Rojas
(74) *Attorney, Agent, or Firm* — Seed IP Law Group LLP

(57) ABSTRACT

MEMS actuator including: a substrate; a first and a second semiconductive layer; a frame including transverse regions formed by the second semiconductive layer, elongated parallel to a first direction and offset along a second direction, the frame being movable parallel to the second direction. The MEMS actuator includes, for each transverse region: corresponding front rotor regions, which are fixed to the transverse region and are suspended above the substrate; a first and a second stator region, which are formed by the first semiconductive layer in such a way that, when the frame is in rest position, the transverse region is laterally offset with respect to the first and the second stator regions and a first front rotor region partially faces the first stator region, and in such a way that, during a translation of the frame along the second direction, the first and/or a second front rotor region at least partially face the second stator region, when the transverse region begins to superimpose on the first stator region.

21 Claims, 12 Drawing Sheets

(56) References Cited

U.S. PATENT DOCUMENTS

| | | | |
|---|---|---|---|
| 6,546,799 B1 | 4/2003 | Vigna et al. | |
| 6,785,086 B1 | 8/2004 | Bonin et al. | |
| 7,619,497 B2 * | 11/2009 | Yuba | H01H 59/0009 335/78 |
| 9,200,689 B2 | 12/2015 | Awtar et al. | |
| 2002/0008922 A1 * | 1/2002 | Conant | B81C 1/00658 359/871 |
| 2002/0021055 A1 * | 2/2002 | Lee | B81C 1/00142 310/309 |
| 2002/0112538 A1 * | 8/2002 | Pinter | B81B 3/0008 73/514.32 |
| 2005/0035682 A1 * | 2/2005 | Tsuboi | H02N 1/008 310/309 |
| 2006/0032310 A1 | 2/2006 | Merassi et al. | |
| 2020/0024131 A1 | 1/2020 | Quaglia et al. | |

OTHER PUBLICATIONS

Hou et al., "Extending displacements of comb drive actuators by adding secondary comb electrodes," *J. Micromech. Microeng.* 16:684-691, 2006. (9 pages).

Olfatnia et al., "Large Stroke Electrostatic Comb-Drive Actuators Enabled by a Novel Flexure Mechanism," *Journal of Microelectromechanical Systems* 22(2):483-494, Apr. 2013.

\* cited by examiner

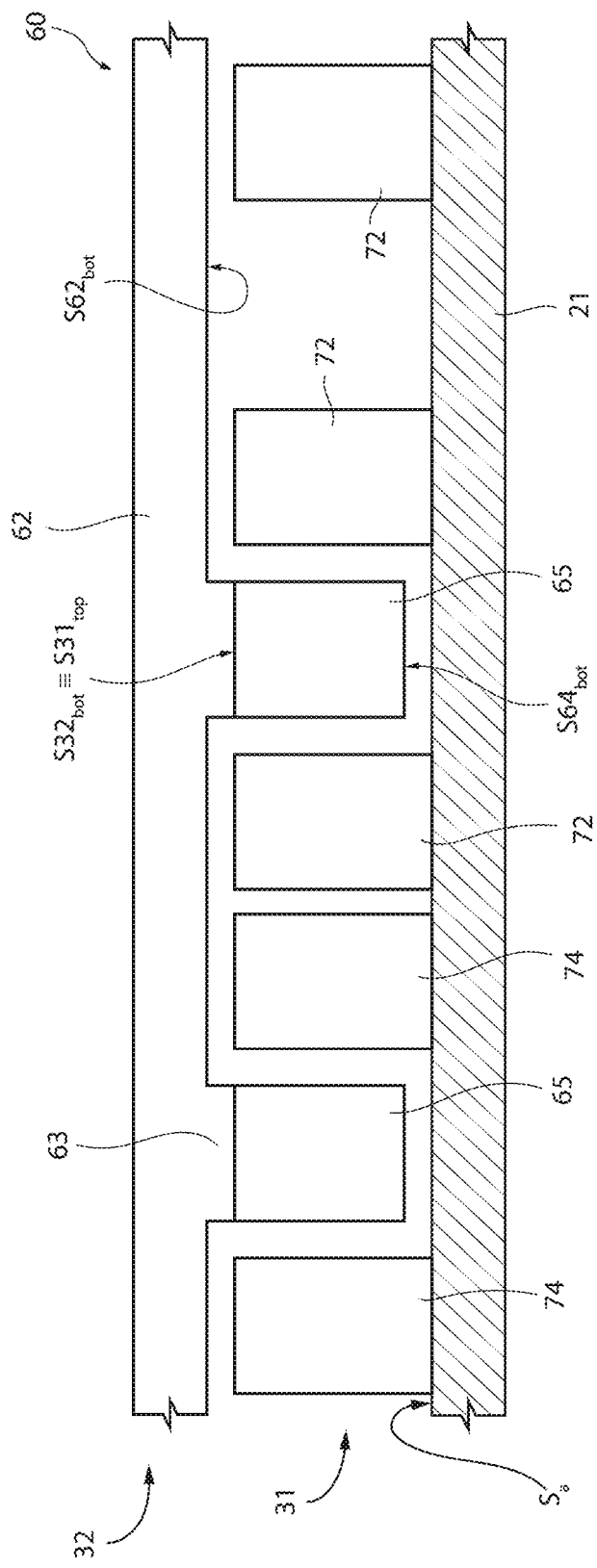
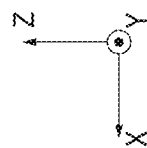

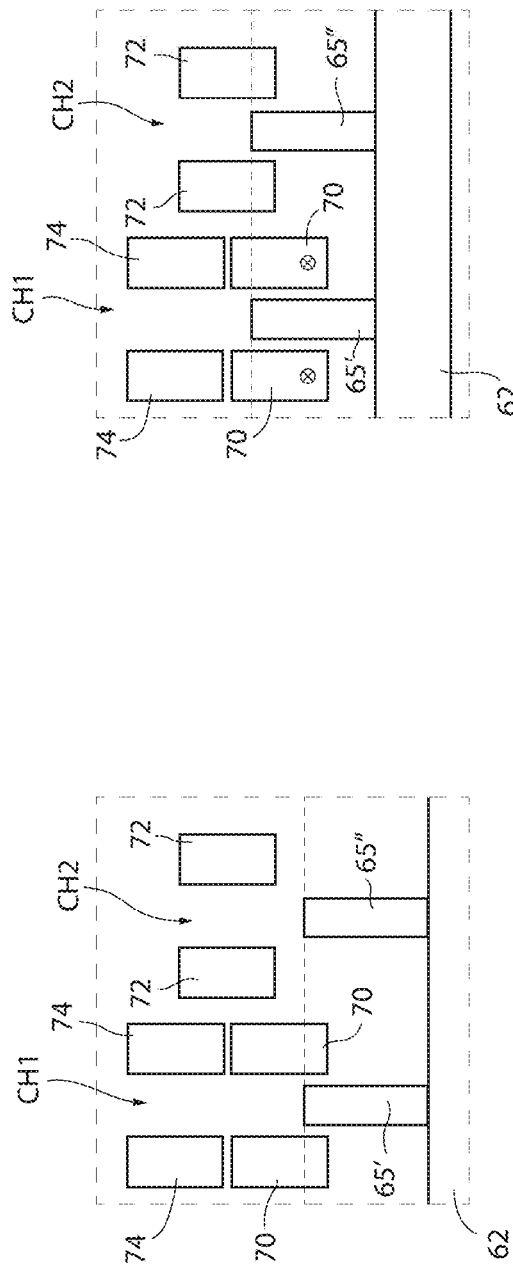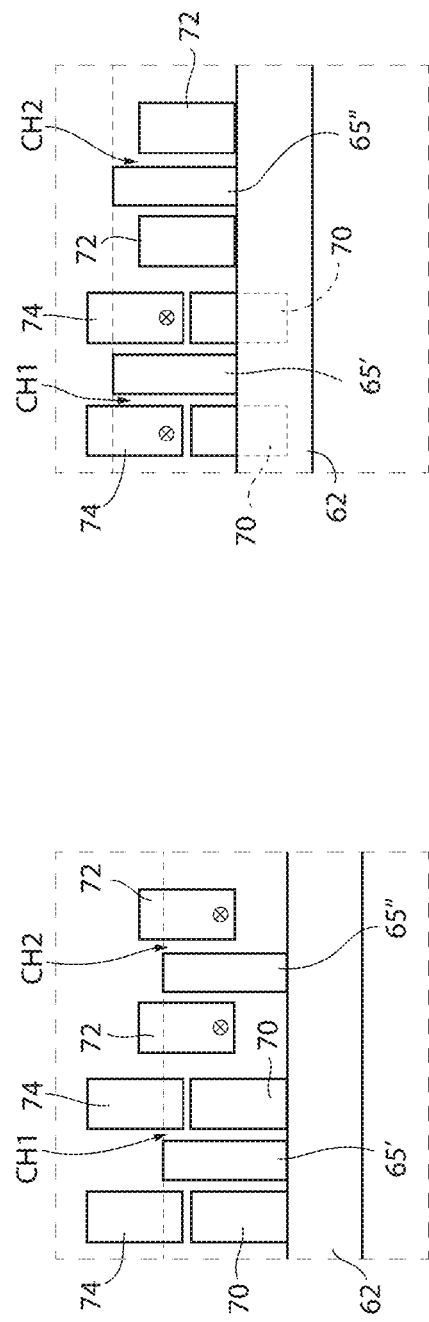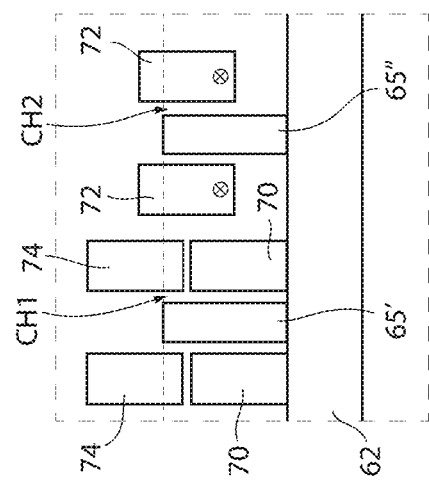

LONG STROKE MEMS ACTUATOR RESILIENT TO THE PULL-IN AND ELECTRONIC SYSTEM INCLUDING THE SAME

BACKGROUND

Technical Field

The present disclosure relates to a long stroke MEMS actuator resilient to the pull-in and to an electronic system including the same.

Description of the Related Art

As is known, nowadays micro-electro-mechanical (MEMS) actuators are available. For instance, FIG. 1A shows an actuation diagram implemented by a MEMS actuator 1.

In detail, the MEMS actuator 1 comprises a stator region 2, which is integral with a substrate (not shown) of the MEMS actuator 1, and a rotor region 3, which forms a so-called shuttle 4 and a rotor actuation region 6. The shuttle 4 and the rotor actuation region 6 form a single piece.

The rotor region 3 is suspended in a cavity 9. In particular, the MEMS actuator 1 comprises a pair of pillars 10, integral with the substrate; the rotor region 3 is mechanically coupled to the pillars 10 by two pairs of bending beams 11, which function as springs. In particular, a first pair of bending beams 11 extend between a first side of the shuttle 4 and one of the two pillars 10, while a second pair of bending beams 11 extend between a second side of the shuttle 4 and the other pillar 11, symmetrically with respect to the first pair of bending beams 11.

The stator region 2 forms a plurality of first elongated elements 13, which are equal to each other and have an elongated shape along a Y axis of an orthogonal XYZ reference system, these first elongated elements 13 being laterally offset along the X axis. The rotor actuation region 6 forms a plurality of second elongated elements 15, which are equal to each other and have an elongated shape along the Y axis and are laterally offset along the X axis, so as to be interdigitated with respect to the first elongated elements 13. In particular, in rest conditions, the first and the second elongated elements 13, 15 are partially superimposed in lateral view.

In practice, the first and the second elongated elements 13, 15 form the plates of a variable capacitor. Moreover, by applying a voltage between the stator region 2 and the rotor region 3, an electrostatic force is generated along the Y axis, which tends to translate the rotor region 3 along the Y axis towards the stator region 2 (therefore, this electrostatic force is positive, given the orientation of the XYZ reference system shown in FIG. 1A), with a consequent increase in the extent of the overlapping, in lateral view, between the first and the second elongated elements 13, 15, as shown in FIG. 1B. The translation along the Y axis of the rotor region 3, and therefore of the shuttle 4, is allowed by the bending beams 11, which are compliant along the Y axis and are rigid along the X axis and along the Z axis.

Moreover, when the rotor region 3 moves away from the position it has in rest conditions, the rotor region 3 is subject to an elastic return force along Y (represented by the elastic constant k travel indicated in FIG. 2), which is due to the stiffness, along the Y axis, of the bending beams 11 and has opposite direction with respect to the aforementioned electrostatic force along the Y axis.

In practice, as to the movements of the rotor region 3 along the Y axis, as the modulus of the voltage present between the stator region 2 and the rotor region 3 increases, there occurs an increase in the extent of the translation of the rotor region 3 with respect to the rest position, intended as the position assumed by the rotor region 3 when a zero voltage is present between the stator region 2 and the rotor region 3. In other words, as the modulus of the voltage present between the stator region 2 and the rotor region 3 increases, there occurs an increase in the stroke of the rotor region 3, and therefore of the shuttle 4.

In addition, when a voltage is present between the stator region 2 and the rotor region 3, the rotor region 3 is subject to an electrostatic force along the X axis, which induces a decrease in stiffness along the X axis as the voltage between the rotor region 2 and the stator region 3 increases, this decrease being due to an electrostatic constant $k_{electrical}$ which has a negative value, and whose modulus increases as the voltage present between the stator region 2 and the rotor region 3 increases.

Moreover, the rotor region 3 is subject to an elastic return force along Y (represented by the elastic constant $k_{bearing}$, indicated in FIG. 2, wherein the shape of the rotor region 3 is not exactly consistent with what is shown in FIGS. 1A-1B, for simplicity of representation), which is due to the stiffness, along the X axis, of the bending beams 11. If the modulus of the electrostatic constant $k_{electrical}$ exceeds the modulus of the elastic constant $k_{bearing}$, the so-called pull-in phenomenon occurs, i.e., the rotor region 3 becomes unstable and tends to translate along the X axis in an uncontrolled (and undesired) manner, until it contacts the stator region 2.

In practice, since the electrostatic constant $k_{electrical}$ increases, in modulus, as the voltage present between the stator region 2 and the rotor region 3 increases, this voltage cannot be increased at will in order to increase the stroke of the MEMS actuator. In fact, the need to avoid the undesired pull-in phenomenon puts a limit on the possibility of increasing the stroke by increasing the voltage present between the stator region 2 and the rotor region 3; in other words, there exists a limit known as the pull-in voltage, which cannot be exceeded.

In order to partially overcome this problem, solutions have been proposed that seek to increase the stiffness along the X axis of the coupling between the rotor region and the substrate, without increasing the stiffness along the Y axis, but this entails an increase in sizes. Other solutions provide for increasing the lateral distance between the first and the second elongated elements 13, 15, in order to reduce the electrostatic constant $k_{electrical}$, with the same voltage applied between the stator region 2 and the rotor region 3, however also these solutions entail an increase in size.

U.S. Pat. No. 6,785,086 discloses a slider for moving a transducing head with respect to a track, which includes a rotor portion, which carries the transducing head and is connected to a stator portion through springs. The stator portion comprises a plurality of stator electrodes; the rotor portion comprises a plurality of rotor electrodes, which are suspended between the stator electrodes. By applying voltages between the stator electrodes and the rotor electrodes, it is possible to generate a force along a lateral direction and a vertical direction, to move the rotor portion with respect to the stator portion.

The paper "A 3-DOF MEMS Electrostatic Piston-Tube actuator", Journal of Microelectromechanical Systems, vol.

24, no. 4, 1 Aug. 2015, pp. 1173-1184 discloses a further example of MEMS actuator, which includes three degrees of freedom.

BRIEF SUMMARY

The present disclosure provides and discloses a MEMS actuator which at least partially overcomes the drawbacks of the prior art as discussed earlier herein.

According to the present disclosure, at least some embodiments of a MEMS actuator and of a control method are provided herein.

For example, in at least one embodiment of the present disclosure, a MEMS actuator comprising: a substrate; a first semiconductive layer extending on top of the substrate; a second semiconductive layer extending on top of the first semiconductive layer; a frame comprising a number of transverse regions, which are formed by the second semiconductive layer, are elongated parallel to a first direction and are offset along a second direction; and a deformable structure, which is formed by at least one of the first and the second semiconductive layers and mechanically couples the frame to the substrate, so that the frame is movable with respect to the substrate parallel to the second direction; said MEMS actuator further comprising, for each transverse region: a plurality of corresponding front rotor regions, which are formed by the first semiconductive layer, are fixed to the transverse region so as to be laterally offset along the transverse region and suspended above the substrate, said front rotor regions protruding with respect to the transverse region, parallel to the second direction; at least one respective first stator cell including at least one first stator region and one second stator region, which are formed by the first semiconductive layer and are fixed to the substrate in such a way that, along the second direction, the second stator region is arranged downstream of the first stator region, the first and the second stator regions being further laterally offset along the first direction so as to be partially facing; and wherein said first and second stator regions are further arranged in such a way that, when the frame is in a rest position, the transverse region is laterally offset with respect to the first and the second stator regions and at least one first front rotor region of said corresponding front rotor regions at least partially faces the first stator region, said first and second stator regions being further arranged in such a way that, during a translation of the frame along the second direction from the rest position, the first front rotor region and/or a second front rotor region of said corresponding front rotor regions at least partially face the second stator region, when the transverse region begins to superimpose on the first stator region

BRIEF DESCRIPTION OF THE SEVERAL VIEWS OF THE DRAWINGS

For a better understanding of the present disclosure, preferred embodiments are now described, purely by way of non-limiting example, with reference to the attached drawings, wherein:

FIG. 6 schematically shows a lateral view of a part of the portion of the MEMS actuator shown in FIG. 4;

FIGS. 8A-8D schematically show top views with portions removed of one of the actuation cells shown in FIG. 7, during subsequent driving steps of the MEMS actuator;

FIG. 3 shows a MEMS actuator 20, which comprises substrate 21 of semiconductor material (for example, silicon), which is not shown in FIG. 3, but is visible in FIG. 4. In particular, the substrate 21 is delimited upwardly by a front surface $S_a$, shown in FIG. 4 and parallel to the XY plane.

DETAILED DESCRIPTION

Figure 1B:
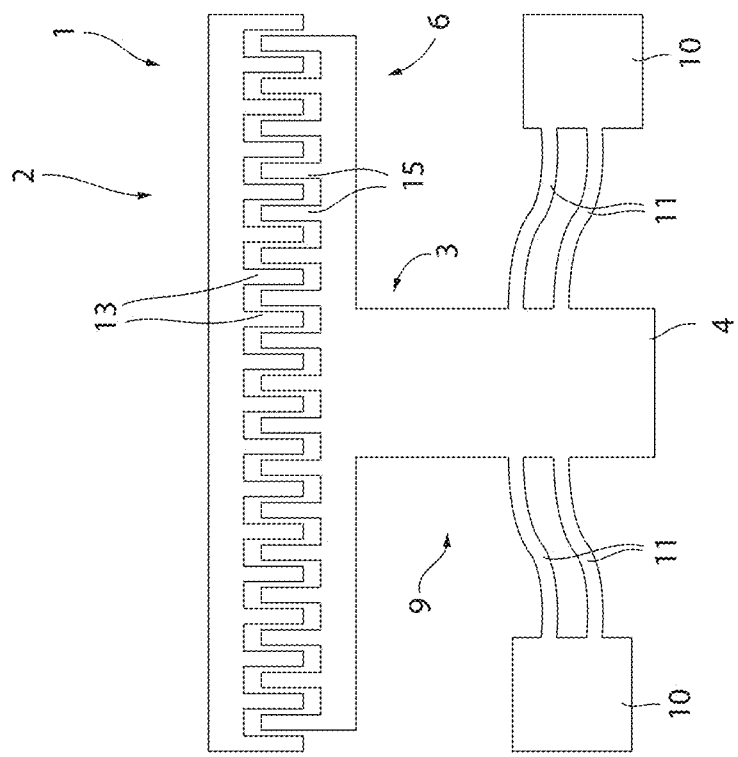
FIGS. 1A and 1B schematically show a top view of a portion of a MEMS actuator, respectively in rest conditions and in actuation conditions.
Figure 1A:
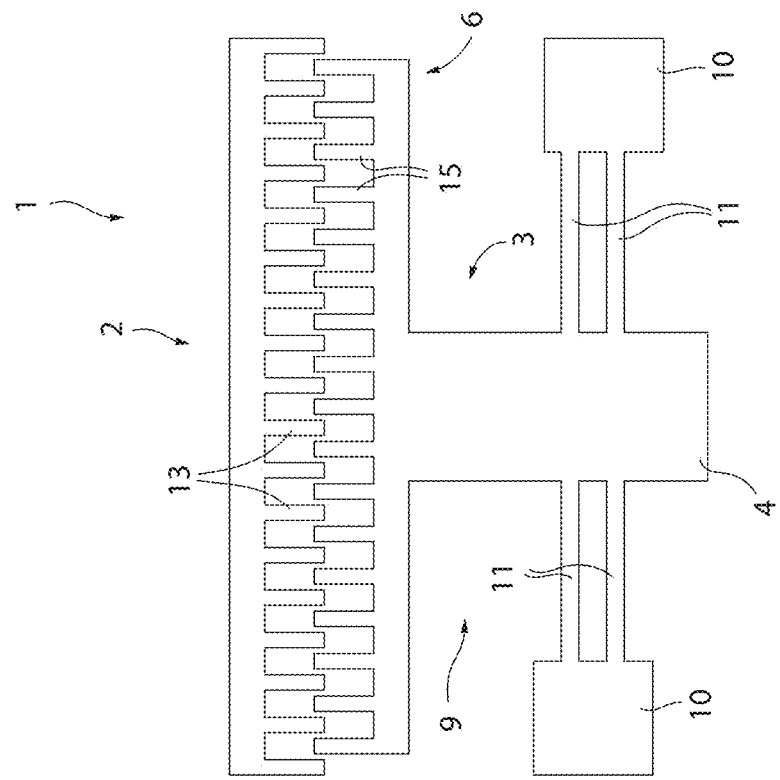
Figure 2:
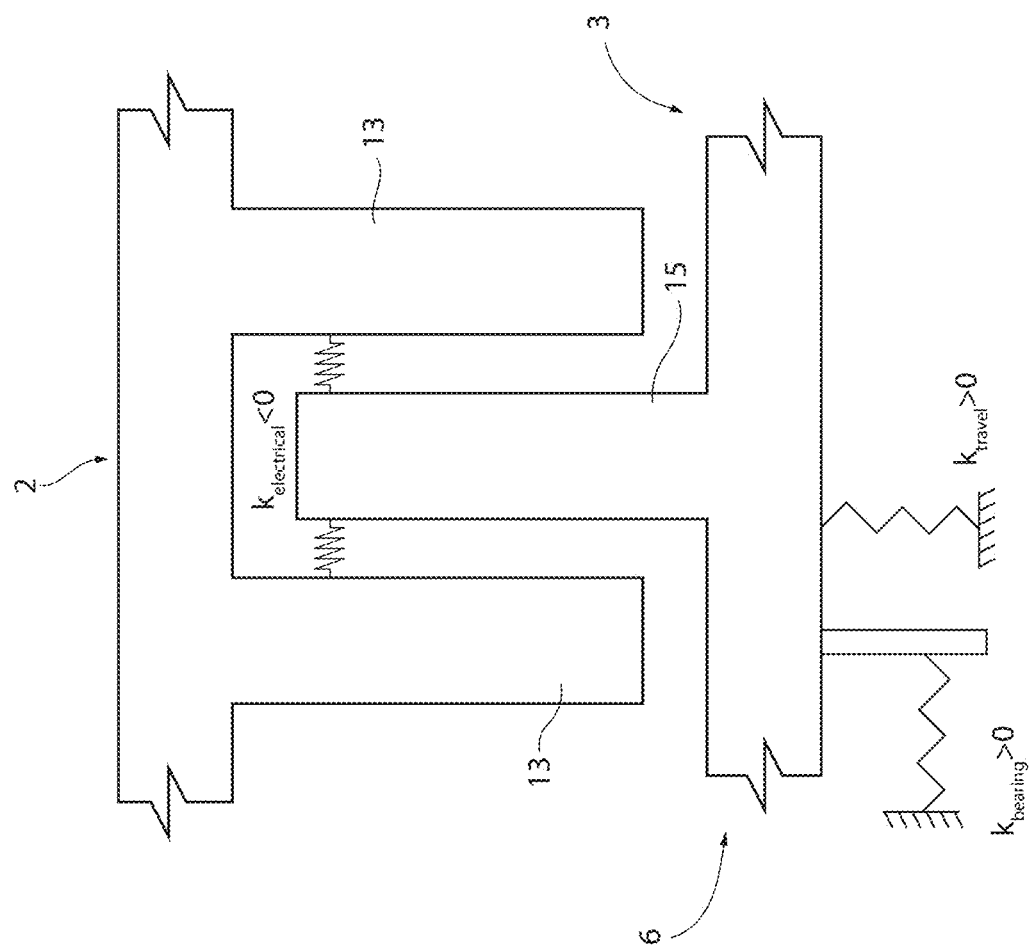
FIG. 2 schematically shows a portion of the MEMS actuator shown in FIGS. 1A-1B and a mechanical diagram relating to forces that are established in the MEMS actuator.

The MEMS actuator 20 further comprises a stator structure 22, which is integral with the substrate 21, and a rotor structure 23, which is suspended in a cavity 24 so as to be movable with respect to the substrate 21 and to the stator structure 22. The cavity 24 extends above the substrate 21.

In detail, the actuator 20 comprises a first and a second epitaxial layer 31, 32, formed by semiconductor material (for example, polycrystalline silicon). The first epitaxial layer 31 extends above the substrate 21; the second epitaxial layer 32 extends above the first epitaxial layer 31.

Without any loss of generality, the rotor structure 23 comprises an external frame 25, which in turn is formed by a first and a second external lateral region 33, 35, which are formed by the first epitaxial layer 31 and have approximately a shape of parallelepipeds elongated along the Y axis and laterally offset along the X axis.

Moreover, the rotor structure 23 comprises an internal frame 27, which is formed by a first and a second internal lateral region 36, 38, which are formed by the first epitaxial layer 31 and have approximately a shape of parallelepipeds elongated along the Y axis and laterally offset along the X axis. In particular, in top view, the first and the second internal lateral regions 36, 38 are interposed between the first and the second external lateral regions 33, 35. Moreover, without any loss of generality, and in order to reduce the sizes, the first and the second internal lateral regions 36, 38 are arranged in proximity, respectively, to the first and the second external lateral regions 33, 35, without contacting them.

The internal frame 27 also comprises a first and a second terminal transverse region 40, 41, which are formed by the first epitaxial layer 31 and have approximately a shape of parallelepipeds elongated along the X axis and laterally offset along the Y axis; moreover, each of the first and the second terminal transverse regions 40, 41 has ends integral, respectively, with the first and the second internal lateral regions 36, 38, wherewith it forms a single piece.

The internal frame 27 further comprises a first and a second coupling region 43, 44, which are formed by the first epitaxial layer 31 and are integral with, respectively, a central portion of the first terminal transverse region 40 and a central portion of the second terminal transverse region 41.

Figure 3:
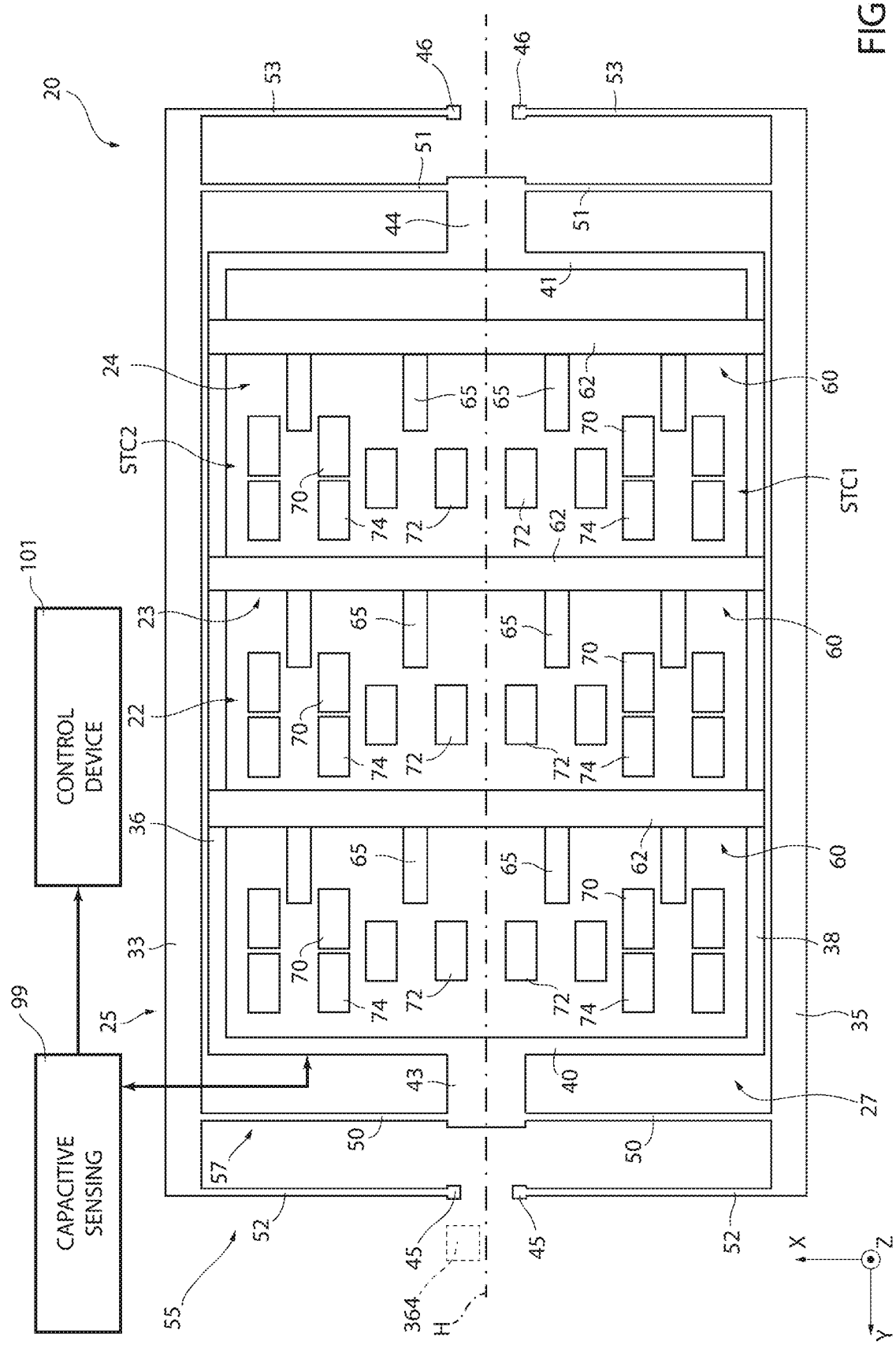
FIG. 3 schematically shows a top view with portions removed of the present MEMS actuator, in rest conditions.

In greater detail, the first and the second coupling regions 43, 44 are symmetrical with respect to an axis parallel to the X axis; moreover, with respect to the orientation of the Y axis shown in FIG. 3, the first coupling region 43 is laterally offset with respect to the first terminal transverse region 40 in a direction concordant with the Y axis, while the second coupling region 44 is laterally offset with respect to the second terminal transverse region 41 in the opposite direction with respect to the Y axis. For example, the first coupling region 43 may extend outward from the first terminal transverse region 40, and the second coupling region 44 may extend outward from the second terminal transverse region 41.

The MEMS actuator 20 further comprises a pair of first pillar regions 45 and a pair of second pillar regions 46, which are formed by the first epitaxial layer 31 and are integral with the underlying substrate 21. Moreover, the first pillar regions 45 are aligned along the Y axis and are laterally offset along the X axis; the second pillar regions 46 are arranged symmetrically with respect to the first pillar regions 45 with respect to an axis parallel to the X axis.

The MEMS actuator 20 further comprises a pair of first internal springs 50 and a pair of second internal springs 51, which are equal to each other, are formed by the first epitaxial layer 31 and, when the rotor structure 23 is in rest conditions, have the shape of parallelepipeds elongated along the X axis. In practice, the first and the second internal springs 50, 51 have the shape of beams. Moreover, one of the first internal springs 50 has ends fixed to the first coupling region 43 and to the first external lateral region 33, while the other first internal spring 50 has ends fixed to the first coupling region 43 and to the second external lateral region 35. One of the second internal springs 51 has ends fixed to the second coupling region 44 and to the first external lateral region 33, while the other second internal spring 51 has ends fixed to the second coupling region 44 and to the second external lateral region 35. The first and the second internal springs 50, 51 are therefore arranged symmetrically.

The MEMS actuator 20 further comprises a pair of first external springs 52 and a pair of second external springs 53, which are equal to each other, are formed by the first epitaxial layer 31 and, when the rotor structure 23 is in rest conditions, have the shape of parallelepipeds elongated along the X axis. In practice, the first and the second external springs 52, 53 have the shape of beams. Moreover, one of the first external springs 52 has ends fixed to a corresponding first pillar region 45 and to the first external lateral region 33, while the other first external spring 52 has ends fixed to a corresponding first pillar region 45 and to the second external lateral region 35. One of the second external springs 53 has ends fixed to a corresponding second pillar region 46 and to the first external lateral region 33, while the other second external spring 53 has ends fixed to a corresponding second pillar region 46 and to the second external lateral region 35. The first and the second external springs 52, 53 are therefore arranged symmetrically. Moreover, without any loss of generality, the first and the second external springs 52, 53 are equal to the first and the second internal springs 50, 51.

In practice, the first and the second internal springs 50, 51 mechanically couple the internal frame 27 to the external frame 25; the first and the second external springs 52, 53 mechanically couple the external frame 25 to the first and the second pillar regions 45, 46, and then to the substrate 21. For example, the first and second pillar regions 45, 46 may be coupled to the substrate 21 or may be integral the substrate 21 such that the first and second pillar regions 45, 46 are anchorage elements that anchor respective ends of the first and second external springs 52, 53 to the substrate 21, respectively. In this manner, both the internal frame 27 and the external frame 25 are suspended in the cavity 24. For example, the internal frame and the external frame 25 may be suspended over the substrate 21.

Moreover, as explained in greater detail hereinafter, each of the first and the second internal springs 50, 51 and the first and the second external springs 52, 53 is a bending beam, which is compliant along the Y axis and is rigid along the X and Z axes. Consequently, the first and the second external springs 52, 53 form a first deformable structure 55 that mechanically couples the external frame 25 to the first and the second pillar regions 45, 46, so as to allow the translation, along the Y axis, of the external frame 25. Moreover, the first and the second internal springs 50, 51 form a second deformable structure 57 which mechanically couples the internal frame 27 to the external frame 25, so as to allow the translation, along the Y axis, of the internal frame 27 with respect to the external frame 25. In this manner, it occurs that, assuming that, as explained hereinafter, a translation occurs along the Y axis of an extent equal to $\Delta Y$ of the internal frame 27 with respect to the own rest position, a simultaneous translation occurs along the Y axis of an extent equal to $\Delta Y/2$ of the external frame 25 with respect to the own rest position, as shown for example in FIG. 5; therefore there occurs a reduction in the stress whereto the first and the second internal springs 50, 51 and the first and the second external springs 52, 53 are subject, with the same translation of the internal frame 27, which functions as a shuttle. In this regard, although not shown in detail, it is anticipated that the MEMS actuator 20 is such that the internal frame 27 may be connected to a transmission member (not shown), so as to transfer movement and forces from the internal frame 27 to a generic external element (not shown).

The internal frame 27 further comprises a plurality (three, in the example of FIG. 3) of transverse regions 60, which are formed by the second epitaxial layer 32, are for example equal to each other and are also aligned along a direction parallel to the Y axis; in particular, without any loss of generality, the transverse regions 60 are evenly spaced along an axis of symmetry H of the MEMS actuator 20, which is parallel to the Y axis.

Figure 4:
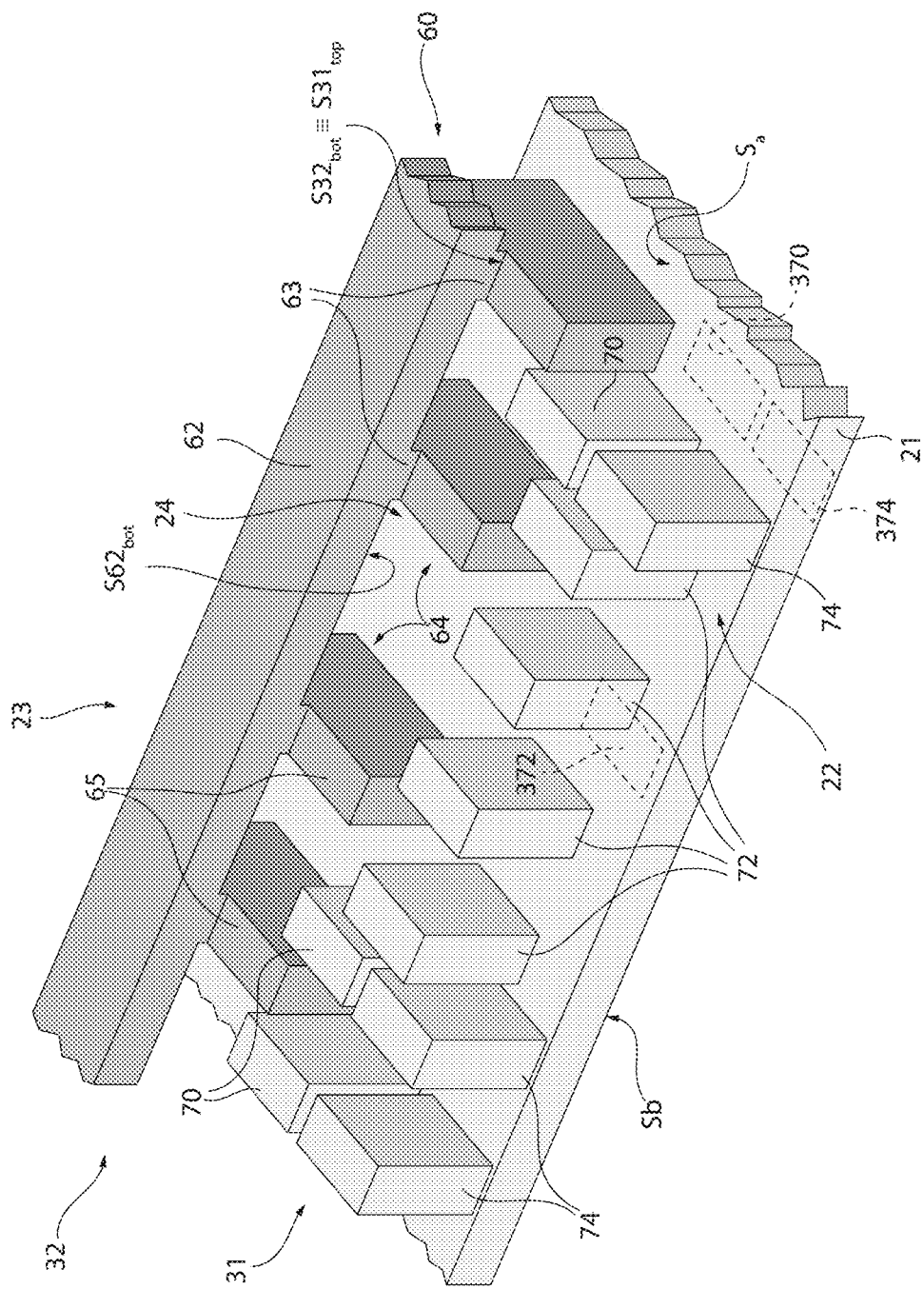
FIG. 4 schematically shows a perspective view with portions removed of a portion of the MEMS actuator shown in FIG. 3.

In greater detail, as better shown in FIG. 4, each transverse region 60 comprises a respective bridge region 62 and a plurality of connection regions 63.

The bridge region 62 has the shape of a parallelepiped elongated along the X axis, with ends integral, respectively, with the underlying first and second internal lateral regions 36, 38, wherewith it forms a single piece. Moreover, the corresponding connection regions 63 extend below the bridge region 62, in the direction of the underlying substrate 21.

As visible also in FIG. 6, indicating with $S32_{bot}$ the bottom surface of the second epitaxial layer 32, i.e., the surface parallel to the XY plane that delimits downwardly the second epitaxial layer 32, and indicating with $S62_{bot}$ the bottom surface (also parallel to the XY plane) of the bridge region 62, it occurs that the bottom surface $S62_{bot}$ of the bridge region 62 extends to a height (measured along the Z axis) higher with respect to the bottom surface $S32_{bot}$ of the second epitaxial layer 32. Moreover, the connection regions 63 have approximately the shape of parallelepipeds and extend between the bottom surface $S62_{bot}$ of the bridge region 62 and the bottom surface $S32_{bot}$ of the second epitaxial layer 32; without any loss of generality, each connection region 63 has the same extension along the Y axis as the overlying bridge region 62. Again without any loss of generality, the connection regions 63 are equal to each other and are arranged in succession parallel to the X axis.

As shown again in FIGS. 4 and 6, the bottom surface $S32_{bot}$ of the second epitaxial layer 32 coincides with a surface indicated with $S31_{top}$, which represents the top surface of the first epitaxial layer 31; in this regard, between the first and the second epitaxial layers 31, 32 there is no interface, i.e., a discontinuity.

For each transverse region 60, the MEMS actuator 20 also comprises a plurality of respective rotor regions 64, formed by the first epitaxial layer 31.

Without any loss of generality, the rotor regions 64 are equal to each other; moreover, for each transverse region 60, the corresponding rotor regions 64 are arranged in succession parallel to the X axis.

In greater detail, each rotor region 64 extends below a corresponding connection region 63, with which it forms a single piece. As a first approximation, and without any loss of generality, each rotor region 64 has the shape of a parallelepiped with a longitudinal axis parallel to the Y axis; moreover, this parallelepiped comprises a respective front protruding part 65, which protrudes with respect to the overlying connection region 63, in a direction concordant with the orientation of the Y axis. In other words, the front protruding part 65 of each rotor region 64 protrudes laterally in a direction concordant with the orientation of the Y axis with respect to the corresponding connection region 63 and to the corresponding bridge region 62. Moreover, as visible in FIG. 6, each rotor region 64 extends along the Z axis between the bottom surface $S32_{bot}$ of the second epitaxial layer 32 and an intermediate surface $S64_{bot}$, which delimits downwardly the rotor regions 64 and overlays, at a distance, the underlying front surface $S_a$ of the substrate 21.

In practice, the rotor regions 64 are suspended above the substrate 21, so as to be able to move with respect to the substrate 21, as described hereinafter. For example, the rotor regions 64 are suspended over the front surface $S_a$ of the substrate 21 such that the rotor regions 64 are spaced apart from the front surface $S_{a+}$ The stator structure 22 comprises, for each transverse region 60 of the rotor structure 23, a corresponding first stator cell STC1 and a corresponding second stator cell STC2, shown in greater detail in FIG. 7. The first and the second stator cells STC1, STC2 are equal and symmetrical with respect to the axis of symmetry H, therefore only the first stator cell STC1 is described hereinafter.

In detail, the first stator cell STC1 comprises a pair of respective first stator regions 70, which are formed by the first epitaxial layer 31, are for example equal to each other and are arranged aligned along a corresponding direction parallel to the X axis, therefore are symmetrical with respect to a corresponding direction parallel to the Y axis.

In greater detail, the first stator regions 70 have the shape of parallelepipeds with longitudinal axes parallel to the Y axis and are fixed, downwardly, to the underlying front surface $S_a$ of the substrate 21; moreover, the first stator regions 70 are delimited upwardly by the top surface $S31_{top}$ of the first epitaxial layer 31.

The first stator cell STC1 further comprises a pair of respective second stator regions 72, which are formed by the first epitaxial layer 31, are for example equal to each other and are arranged aligned parallel to a corresponding direction parallel to the X axis, which has a coordinate along the Y axis greater than the coordinate along the Y axis of the direction parallel to the X axis wherealong the first stator regions 70 are arranged; in other words, along the Y axis, the second stator regions 72 are arranged downstream of the first stator regions 70.

The second stator regions 72 are therefore symmetrical with respect to a corresponding direction parallel to the Y axis. Moreover, the pair of second stator regions 72 is laterally offset along the X axis with respect to the pair of first stator regions 70; in particular, given the orientation of the X axis shown in FIG. 7, the pair of second stator regions 72 has a coordinate along X greater than the coordinate along X of the first pair of stator regions 70.

In greater detail, the second stator regions 72 have the shape of parallelepipeds with longitudinal axes parallel to the Y axis and are fixed, downwardly, to the underlying front surface $S_a$ of the substrate 21; moreover, the second stator regions 72 are delimited upwardly by the top surface $S31_{top}$ of the first epitaxial layer 31.

The first stator cell STC1 further comprises a pair of respective third stator regions 74, which are formed by the first epitaxial layer 31, are for example equal to each other and are arranged aligned along a corresponding direction parallel to the X axis, which has a coordinate along the Y axis greater than the coordinate along the Y axis of the direction parallel to the X axis wherealong the second stator regions 72 are aligned; in other words, with respect to the Y axis, the third stator regions 74 are arranged downstream of the second stator regions 72. Moreover, the third stator regions 74 are symmetrical with respect to a corresponding direction parallel to the Y axis.

In greater detail, the third stator regions 74 have the shape of parallelepipeds with longitudinal axes parallel to the Y axis and are fixed, downwardly, to the underlying front surface $S_a$ of the substrate 21; moreover, the third stator regions 74 are delimited upwardly by the top surface $S31_{top}$ of the first epitaxial layer 31.

Without any loss of generality, each third stator region 74 is aligned with a corresponding first stator region 70, along a corresponding direction parallel to the Y axis; in other words, the pair of third stator regions 74 is aligned with the pair of first stator regions 70 along a corresponding direction parallel to the Y axis. The first and the third stator regions 70, 74 may be equal to each other; also the second stator regions 72 may be equal to the first and the third stator regions 70,74.

The pair of first stator regions 70 and the pair of third stator regions 74 laterally delimit a first channel CH1, which extends parallel to the Y axis, is open upwardly and is closed downwardly by the substrate 21. The pair of second stator regions 72 laterally delimits a second channel CH2, which extends parallel to the Y axis, is open upwardly and is closed downwardly by the substrate 21. The first and the second channels CH1, CH2 are therefore parallel to each other and laterally offset along the X axis.

Moreover, each second stator region 72 extends on a domain in Y which is partially superimposed on the domains in Y of the first and the third stator regions 70, 74; in other words, along the Y axis, the second stator regions 72 are offset with respect to the first and the third stator regions 70, 74 in such a way that the projections on the Y axis of the second stator regions 72 are partially superimposed on the projections on the Y axis of the first and the third stator regions 70, 74. Even in more detail, as visible in FIG. 7, which refers to rest conditions, wherein no voltages are applied to the pairs of first, second and third stator regions 70, 72, 74, nor to the rotor regions 64, the first stator cell STC1 is operatively coupled to a corresponding pair of front protruding parts of corresponding rotor regions 64, indicated respectively with 65' and with 65", which are hereinafter referred to as, respectively, the first and the second front protruding parts 65', 65".

Without any loss of generality, the first and the second front protruding parts 65', 65" are adjacent. Moreover, as explained in greater detail hereinafter, the first stator cell STC1 has a geometry such that, in case the internal frame 27 translates along the axis of symmetry H, and therefore parallel to the Y axis, the first and the second front protruding parts 65', 65" may slide respectively along the first and the second channels CH1, CH2, without contacting the first, the second and the third stator regions 70, 72, 74. In other words, the first and the second front protruding parts 65', 65" are aligned, respectively, with the first and the second channels CH1, CH2. In this manner, the MEMS actuator 20 may be controlled as described hereinafter, with reference, for simplicity, to the sole first stator cell STC1; the second stator cell STC2 is in fact controlled in the same manner as the first stator cell STC1.

In detail, in rest conditions (FIG. 8A), the first front protruding part 65' is partially inside the first channel CH1, i.e., it is partially interposed between the first stator regions 70. In other words, a portion of the first front protruding part 65' faces corresponding portions of the first stator regions 70, wherewith it forms a variable capacitor. The second front protruding part 65" is instead outside the second channel CH2, i.e., the projection on the Y axis of the second front protruding part 65" is separated from the projection on the Y axis of the second stator regions 72; the second front protruding part 65" therefore does not face the second stator regions 72. Moreover, the bridge region 62 is laterally offset with respect to the first and the second stator regions 70,72.

Under these conditions, a voltage $V_d$ is applied to the first stator regions 70, as shown in FIG. 8B, wherein the presence of this voltage on the first stator regions 70 is indicated by a circle with a cross. An electrostatic force is thus generated between the first stator regions 70 and the first front protruding part 65', which in fact form a variable capacitor; this electrostatic force drags the first front protruding part 65', and therefore also the internal frame 27, along the axis of symmetry H. This dragging causes the first front protruding part 65' to further penetrate within the first channel CH1 and, at a certain point, the second front protruding part 65" to penetrate inside the second channel CH2, i.e., to begin facing the second stator regions 72, before the first front protruding part 65' begins to face the third stator regions 74; in particular, without any loss of generality, when the second front protruding part 65" begins to face the second stator regions 72, a distal portion of the first front protruding part 65' (intended as the more distant portion from the bridge region 62) has not yet passed the first stator regions 70. Moreover, the second front protruding part 65" begins to face the second stator regions 72 before the bridge region 62 begins to superimpose on the first stator regions 70.

As shown in FIG. 8B, after a portion of the second front protruding part 65" faces corresponding portions of the second stator regions 72, wherewith it forms a corresponding variable capacitor, and before the bridge region 62 begins to superimpose on the first stator regions 70, it is possible to cancel the voltage present on the first stator regions 70 and apply the voltage $V_d$ to the second stator regions 72, as shown in FIG. 8C, so as to generate an electrostatic force between the second stator regions 72 and the second front protruding part 65", which drags the second front protruding part 65", so as to continue to drag the internal frame 27 along the axis of symmetry H, seamlessly.

In practice, owing to the fact that, during the translation of the internal frame 27 parallel to the Y axis, the second front protruding part 65" begins to face corresponding portions of the second stator regions 72 before the bridge region 62 begins to superimpose on the first stator regions 70, it is possible to cancel the voltage present on the first stator regions 70 and apply the voltage $V_d$ to the second stator regions 72 before the bridge region 62 begins to superimpose on the first stator regions 70. In this manner, when the bridge region 62 begins to superimpose on the first stator regions 70 (without contacting them, given the greater height of the bottom surface $S62_{bot}$ of the bridge region 62 with respect to the top surface S3 hop which delimits the first stator regions 70), the latter are already voltage-free, so as to avoid the generation of undesired electrostatic forces in the vertical direction, which could compromise the movement of the internal frame 27.

Again with reference to FIG. 8C, the dragging of the internal frame 27 operated by the electrostatic force acting on the second front protruding part 65" causes, at a certain point, the first front protruding part 65' to begin facing the third stator regions 74; in particular, in the example shown in FIG. 8C, when the first front protruding part 65' begins to face the third stator regions 74, the distal portion of the second front protruding part 65" has not yet passed the second stator regions 72.

As shown in FIG. 8C, after a portion of the first front protruding part 65' faces corresponding portions of the third stator regions 74, wherewith it forms a corresponding variable capacitor, it is possible to cancel the voltage present on the second stator regions 72 and apply the voltage $V_d$ to the third stator regions 74, as shown in FIG. 8D, so as to generate an electrostatic force between the third stator regions 74 and the first front protruding part 65', which drags the first front protruding part 65', so as to continue to drag the internal frame 27 parallel to the Y axis. Also in this case, the geometry of the front protruding parts 65 and of the bridge regions 62 is such that, during the translation of the internal frame 27, the first front protruding part 65' begins to face corresponding portions of the third stator regions 74 before the bridge region 62 begins to superimpose on the second stator regions 72. It is therefore possible to cancel the voltage present on the second stator regions 72 and apply the voltage $V_d$ to the third stator regions 74 before the bridge region 62 begins to superimpose on the second stator regions 72, so as to avoid the generation of undesired electrostatic forces in the vertical direction.

Subsequently, after the internal frame 27 has reached the position of maximum translation with respect to the rest position, i.e., the position wherein, as a first approximation, the third stator regions 74 face entirely the first front protruding part 65', it is possible to maintain the voltage on the third stator regions 74, in order to maintain the internal frame 27 in this position of maximum translation for a desired time. Subsequently, it is possible to cancel the voltage on the third stator regions 74, so as to allow the elastic return to take the internal frame 27 back to the rest position.

Figure 5:
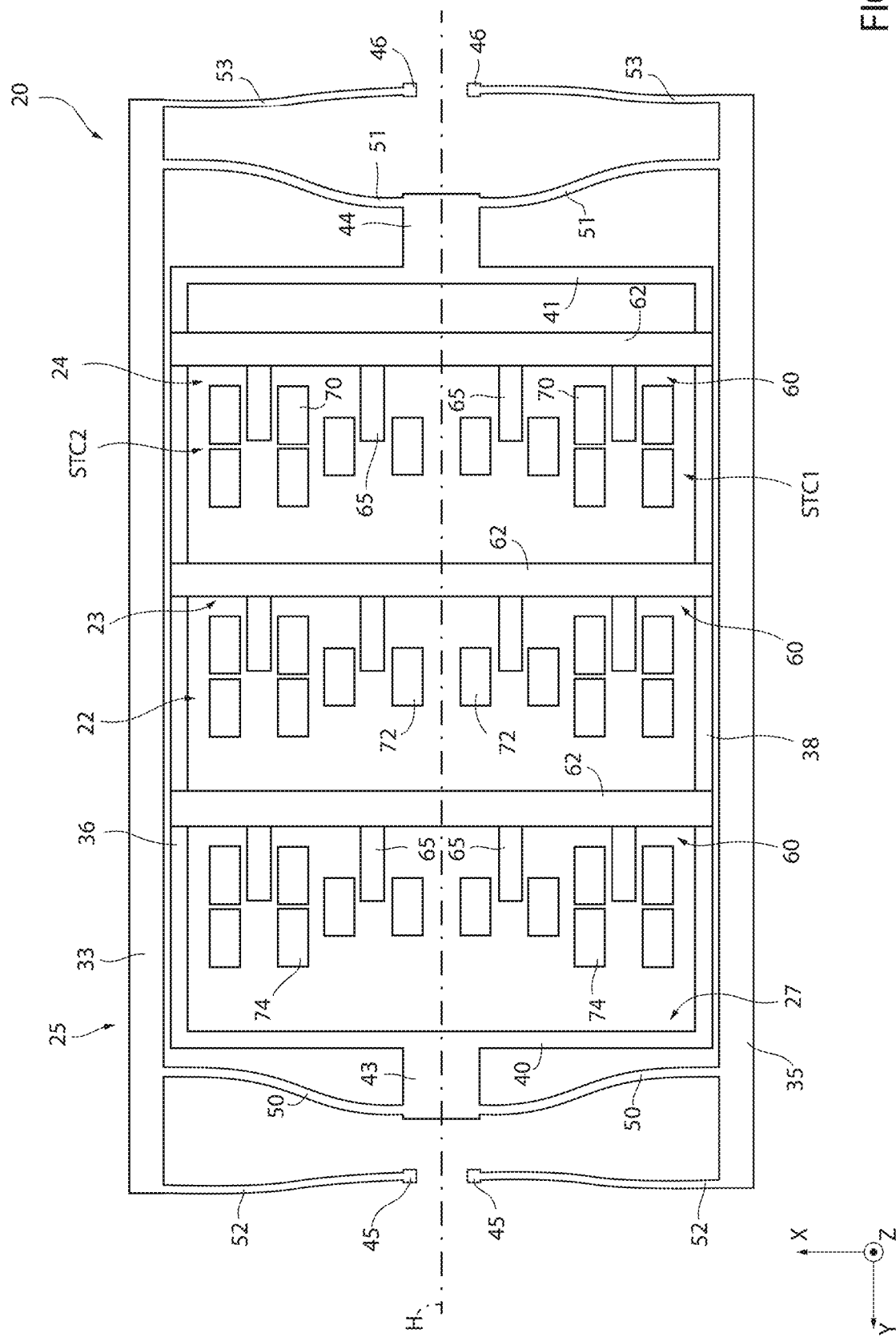
FIG. 5 schematically shows a top view with portions removed of the present MEMS actuator, in driving conditions.

Again with reference to what is shown in FIGS. 8A-8D, it is observed how, although not described in detail, the movement of the internal frame 27 previously described entails a simultaneous translation along the Y axis also of the external frame 25, but of half the extent, as previously mentioned and as qualitatively shown in FIG. 5. Moreover, as previously mentioned, the considerations made about the first stator cell STC1 also apply to the second stator cell STC2; in particular, the first, the second and the third stator regions 70, 72, 74 of the second stator cell STC2 may be set to the same voltages, respectively, as the first, the second and the third stator regions 70, 72, 74 of the first stator cell STC1.

Moreover, as shown qualitatively in FIG. 3, the MEMS actuator 20 comprises a capacitive sensing structure 99 of a per se known type, which is mechanically coupled to the internal frame 27 so as to generate an electrical signal indicative of the position along the Y axis of the internal frame 27. For example, although not shown, the capacitive sensing structure 99 may be formed by facing capacitive plates, formed by portions of the first and the second epitaxial layers 31, 32 and/or by further semiconductive layers not described; alternatively, the capacitive sensing structure 99 may be formed by a corresponding comb capacitive structure.

This electrical signal may be supplied to an electronic control device 101, which is electrically coupeable in a releasable manner to the MEMS actuator 20 and is configured to bias the first, the second and the third stator regions 70, 72, 74 of the first and the second stator cells STC1, STC2 in the manner described with reference to FIGS. 8A-8D, as a function of the aforementioned electrical signal. To this end, although not shown, the MEMS actuator 20 may comprise for example metallizations electrically coupeable to the electronic control device 101 so as to allow the first, the second and the third stator regions 70, 72, 74 and the rotor regions 64 to be biased. In this regard, although previously the operations of FIGS. 8A-8D have been described with reference to the case wherein the rotor regions 64 are at zero voltage, it is possible to bias the rotor regions 64 to a reference voltage; in this case, the first, the second and the third stator regions 70, 72, 74 are alternatively set at the voltage $V_d$ or at the reference voltage.

Figure 7:
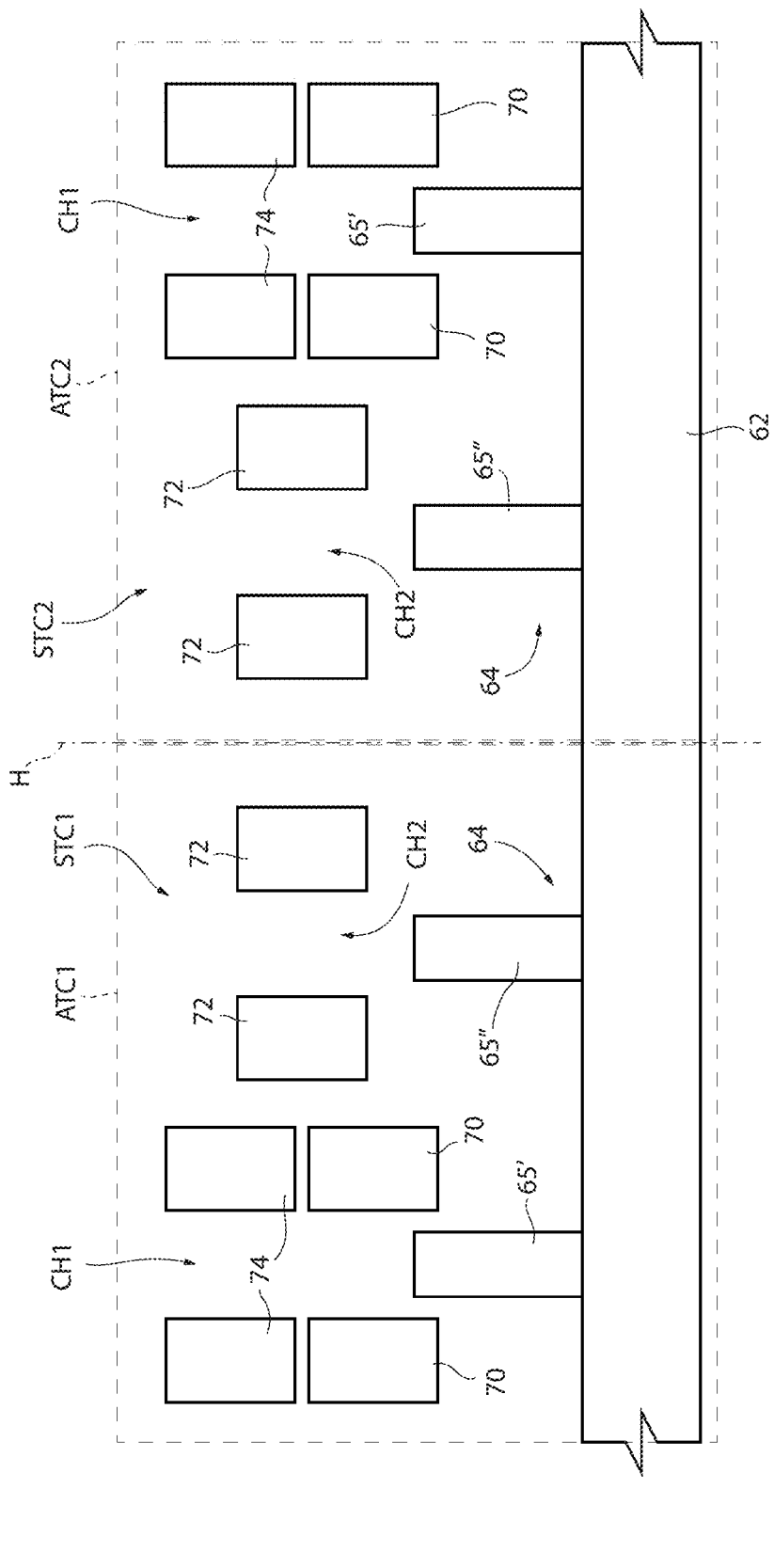
FIG. 7 schematically shows a top view with portions removed of a pair of actuation cells of the MEMS actuator shown in FIG. 3, in rest conditions.

For practical purposes, the first and the second stator cells STC1, STC2 respectively form a first and a second actuation cell, respectively together with the corresponding first and second front protruding parts 65' and 65" and with corresponding portions of the bridge region 62. The first and the second actuation cells are indicated in FIG. 7 respectively with ATC1 and ATC2 and are symmetrical with respect to the axis of symmetry H, so that balanced forces and torques act as a whole on the internal frame 27; in fact, inside each of the first and the second actuation cells ATC1, ATC2 it occurs that the forces are locally balanced, while the torques are not. However, owing to the symmetry of the first and the second actuation cells ATC1, ATC2, also the torques are balanced as a whole.

Although not shown, variants are possible wherein the first stator cell STC1, and therefore also the second stator cell STC2, comprises a greater number of pairs of first, second and third stator regions 70, 72, 74, and therefore a greater number of first and second channels CH1, CH2, which may be travelled by corresponding front protruding parts 65 of rotor regions 64 in the same manner as previously described.

Moreover, although not shown, embodiments without the third stator regions 74 are possible; this statement applies in general to all the embodiments described herein, although the absence of the third stator regions 74 entails a reduction in the stroke of the MEMS actuator 20; moreover, the presence of the third stator regions 74 allows to implement a configuration of the type of stepper motors. For these reasons, hereinafter embodiments are described which include the third stator regions 74, unless otherwise specified.

Figure 9:
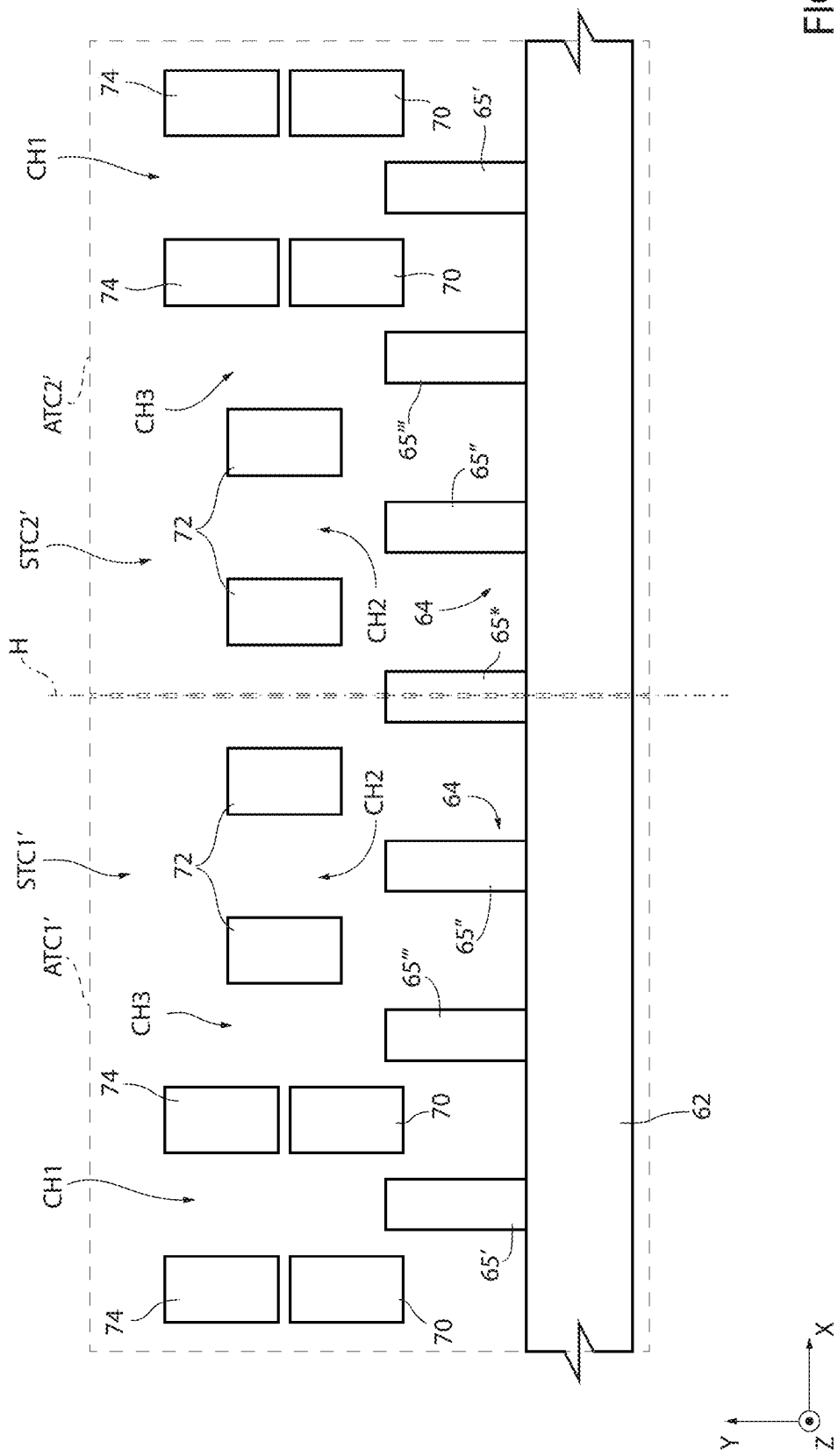
FIG. 9 schematically shows a top view with portions removed of a pair of actuation cells of a variant of the MEMS actuator, in rest conditions.

FIG. 9 shows a further embodiment, which is described with reference to the sole differences with respect to the embodiment shown in FIG. 7.

In detail, the first stator cell (indicated with STC1') is operatively coupled, in addition to the first and the second front protruding parts 65', 65", to a third front protruding part 65''', which is interposed between the first and the second front protruding parts 65', 65".

Moreover, the translation of the internal frame 27 along the axis of symmetry H causes, while the first and the second front protruding parts 65', 65" may slide respectively along the first and the second channels CH1, CH2, the third front protruding part 65''' to be able to slide into a third channel CH3, which is laterally delimited, on one side, by the first stator region 70 facing towards the pair of second stator regions 72 and by the corresponding third stator region 74, and on the other side by the second stator region 72 facing towards said first stator region 70 and corresponding third stator region 74. Moreover, in rest conditions, the third front protruding part 65''' partly faces a portion of the first stator region 70 facing towards the pair of second stator regions 72, but is laterally separated, along the Y axis, from the aforementioned second stator region 72.

In addition, without any loss of generality, an optional front protruding part 65* may slide into an additional channel CH*, which extends between the first and the second stator cells STC1', STC2', since it is delimited by the second stator regions 72 of the first and the second stator cells STC1', STC2' which face on each other.

The presence of the third front protruding part 65''', and possibly also of the optional front protruding part 65*, allows the force acting on the internal frame 27 to be increased, as a first approximation without increasing the sizes with respect to the embodiment shown in FIG. 7.

The MEMS actuator 20 shown in FIG. 9 may be controlled by biasing the first, the second and the third stator regions 70, 72, 74 in the same manner described with reference to FIGS. 8A-8D. In this manner, although not shown, when the voltage $V_d$ is applied to the first stator regions 70, the third front protruding part 65''' is also subject to an electrostatic force; moreover, when the voltage $V_d$ is applied to the second stator regions 72, a portion of the third front protruding part 65''' faces a portion of the second stator region 72 which laterally delimits the third channel CH3, therefore the third front protruding part 65''' is still subject to an electrostatic force. Finally, when the voltage $V_d$ is applied to the third stator regions 74, a portion of the third front protruding part 65''' faces a portion of the third stator region 74 which laterally delimits the third channel CH3, therefore the third front protruding part 65''' is still subject to an electrostatic force.

In greater detail, while the first and the second front protruding parts 65', 65" continue to experience electrostatic forces approximately directed only parallel to the Y axis because at every instant they experience, on opposite sides, equal voltages, the third front protruding part 65''' is subject to electrostatic forces that include a component parallel to the X axis, caused by the asymmetry of the voltages present on the sides of the third channel CH3. This component along X is however balanced by the component along X of the electrostatic forces acting on the third front protruding part 65''' which is coupled with the second stator cell STC2'.

In practice, referring to the first and the second actuation cells ATC1' and ATC2' to indicate the actuation cells formed by the first and the second stator cells STC1', STC2' with the respective first, second and third front protruding parts 65', 65'', 65''' and the corresponding portions of the bridge region 62, each of the first and the second actuation cells ATC1' and ATC2' introduces forces and torques acting on the internal frame 27 in an unbalanced manner, however, owing to the symmetry present between the first and the second actuation cells ATC1' and ATC2', the forces and the torques acting on the internal frame 27 as a whole are balanced.

Figure 10:
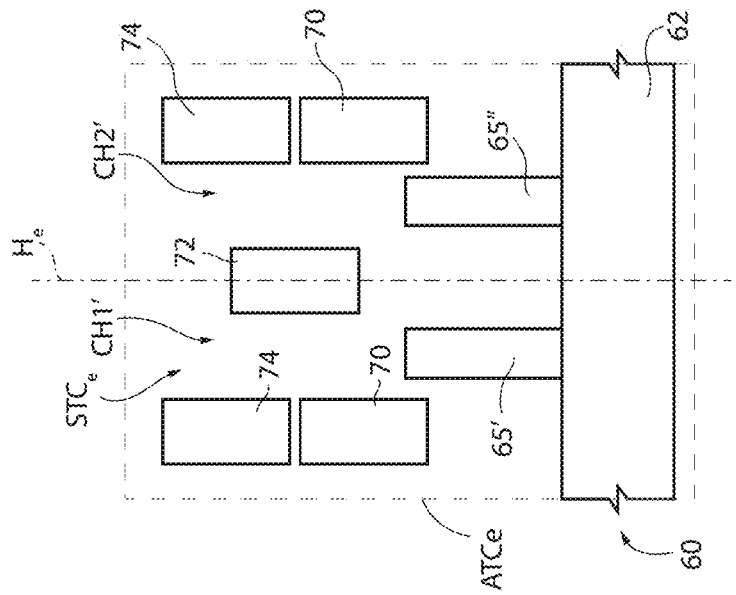
FIG. 10 schematically shows a top view with portions removed of an actuation cell of a further variant of the MEMS actuator, in rest conditions.

There are also possible embodiments wherein the actuation cells are of the type shown in FIG. 10, wherein the actuation cell is indicated with $ATC_e$ and includes a balanced stator cell $STC_e$, which is now described with reference to the differences with respect to the first actuation cell STC1 shown in FIG. 7.

In detail, the balanced stator cell $STC_e$ comprises only one second stator region 72, which, with respect to what is shown in FIG. 7, has the same coordinate along the Y axis, but is translated along the X axis in such a way that a proximal part (intended as the part closest to the bridge region 62) of the second stator region 72 is interposed, at a distance, between the two first stator regions 70; moreover, a distal part of the second stator region 72 is interposed, at a distance, between the two third stator regions 74.

Consequently, as already occurs in the case of the third channel CH3 of the embodiment shown in FIG. 9, the first channel (indicated with CH1') is delimited by the second stator region 72 and by the first and the third stator regions 70, 74 which extend on a first side of the second stator region 72, while the second channel (indicated with CH2') is delimited by the second stator region 72 and by the first and the third stator regions 70, 74 which extend on a second side of the second stator region 72.

The first and the second front protruding parts 65', 65'' are respectively aligned with the first and the second channels CH1', CH2', so as to be able to slide therein during the translation parallel to the Y axis of the internal frame 27. Moreover, both the balanced stator cell $STC_e$ and actuation cell $ATC_e$ are symmetrical with respect to a cell symmetry axis He, parallel to the Y axis.

The embodiment shown in FIG. 10 may also be controlled in the same manner as described with reference to FIGS. 8A-8D. Therefore, it occurs that, in rest conditions, portions of the first and the second front protruding parts 65', 65'' face, each, a portion of a corresponding first stator region 70; when the voltage $V_d$ is applied to the first stator regions 70, both the first and the second front protruding parts 65', 65'' are subject to electrostatic forces that drag them. Moreover, when portions of the first and the second front protruding parts 65', 65'' begin to face the second stator region 72 (before the bridge region 62 begins to superimpose on the first stator regions 70), it is possible to cancel the voltage on the first stator regions 70 and apply the voltage $V_d$ to the second stator region 72, so that the first and the second front protruding parts 65', 65'' are still subject to electrostatic forces which drag them. Finally, when portions of the first and the second front protruding parts 65', 65'' begin to face, each, a corresponding third stator region 74 (before the bridge region 62 begins to superimpose on the second stator region 72), it is possible to cancel the voltage on the second stator region 72 and apply the voltage $V_d$ to the third stator regions 74, so that the first and the second front protruding parts 65', 65'' are still subject to electrostatic forces which drag them.

In greater detail, the electrostatic forces acting on the first and the second front protruding parts 65', 65'' are the same as described with reference to the third front protruding part 65''' shown in FIG. 9; moreover, the components along the X axis of these electrostatic forces balance each other, inside the same actuation cell $ATC_e$.

In practice, owing to the symmetry, forces and torques are generated in the actuation cell $ATC_e$ acting locally on the corresponding portion of the internal frame 27 in a balanced manner. Consequently, although not shown, the MEMS actuator 20 may comprise, for each transverse region 60, a plurality of actuation cells $ATC_e$ laterally offset parallel to the X axis.

Figure 11:
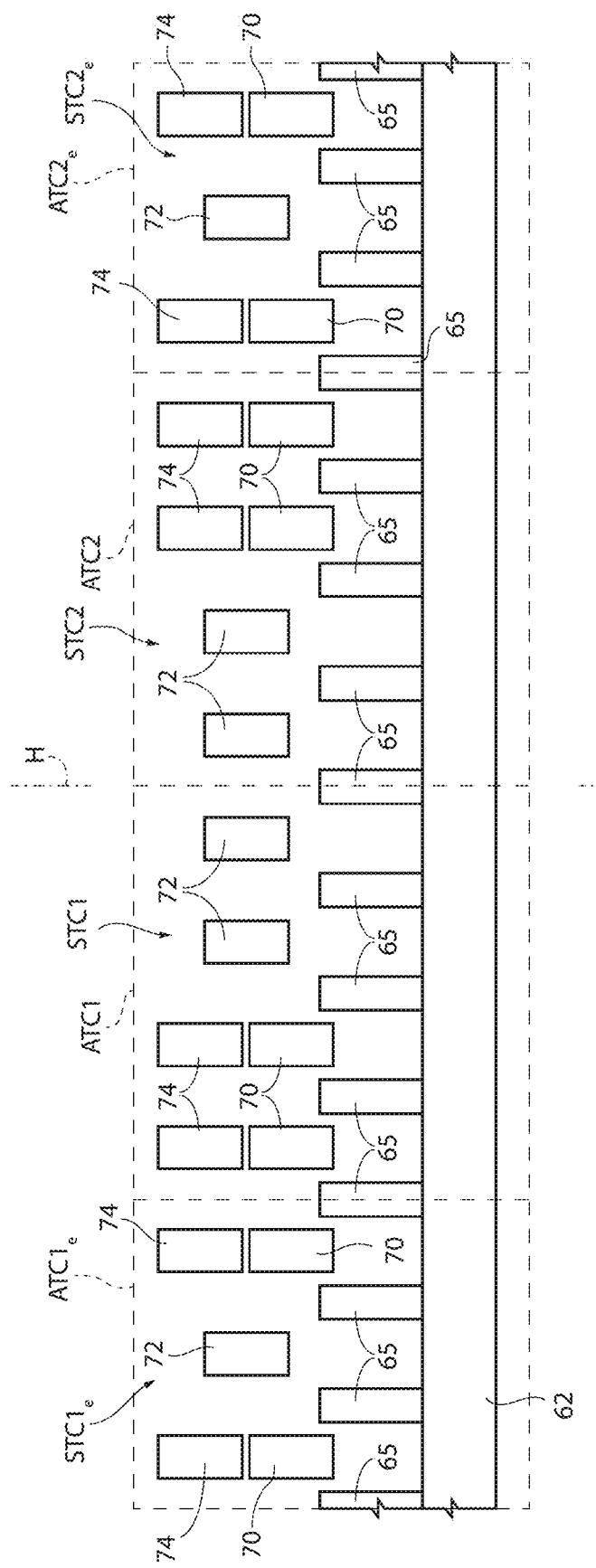
FIG. 11 schematically shows a top view with portions removed of a set of actuation cells of a further variant of the MEMS actuator, in rest conditions.

Embodiments are also possible wherein, for each transverse region 60, combinations of stator cells (and of corresponding actuation cells) previously described are present, which are arranged parallel to the X axis so as to form a symmetrical arrangement with respect to the axis of symmetry H. For example, FIG. 11 shows a combination that includes a first and a second balanced stator cell $STC1_e$, $STC2_e$, which form corresponding actuation cells indicated with $ATC1_e$, $ATC2_e$ and are arranged respectively on the sides of the first and the second stator cells STC1, STC2 already shown in FIG. 7, so as to ensure the overall balancing of the forces and the torques.

Figure 12:
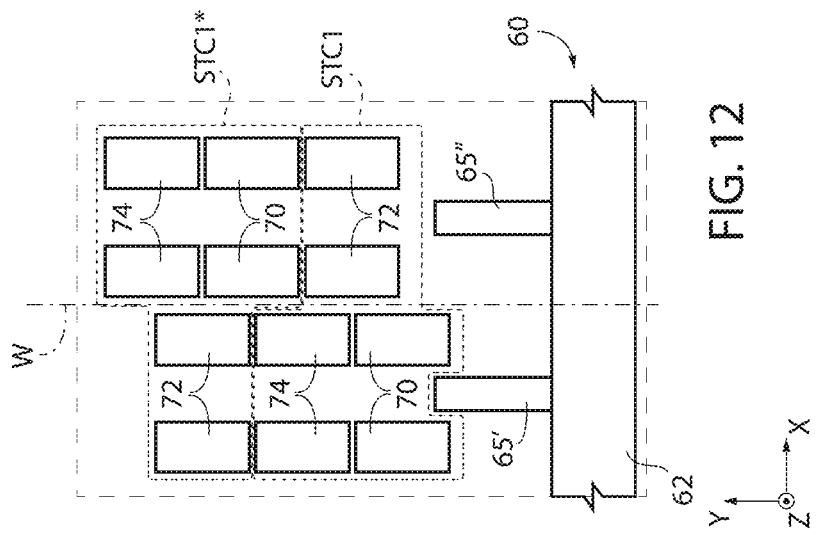

Embodiments of the same type previously described are also possible, but wherein, for each stator cell of each transverse region, one or more additional stator cells of the same type are present, which are stacked together with the stator cell along a corresponding direction parallel to the Y axis, so as to increase the stroke of the MEMS actuator 20. For example, FIG. 12 shows an embodiment wherein, in addition to the first stator cell STC1, a first additional stator cell STC1* of the same type as the first stator cell STC1 is present and stacked to the latter along a corresponding direction parallel to the Y axis. Moreover, the first additional stator cell STC1* is equal to the first stator cell STC1, unless a flip over around a W axis parallel to the Y axis occurs.

The embodiment shown in FIG. 12 may also be controlled in the same manner as described with reference to FIGS. 8A-8D. In particular, the first, the second and the third stator regions 70, 72, 74 of the first additional stator cell STC1* are not biased during the driving of the first stator cell STC1; once the driving of the first stator cell STC1 has ended, the same voltages applied respectively to the first, the second and the third stator regions 70, 72, 74 of the first stator cell STC1 and described with reference to FIGS. 8A-8B are applied to the first, the second and the third stator regions 70, 72, 74 of the first additional stator cell STC1*.

In this manner, the length of the stroke of the MEMS actuator 20 is further increased.

Figure 13:
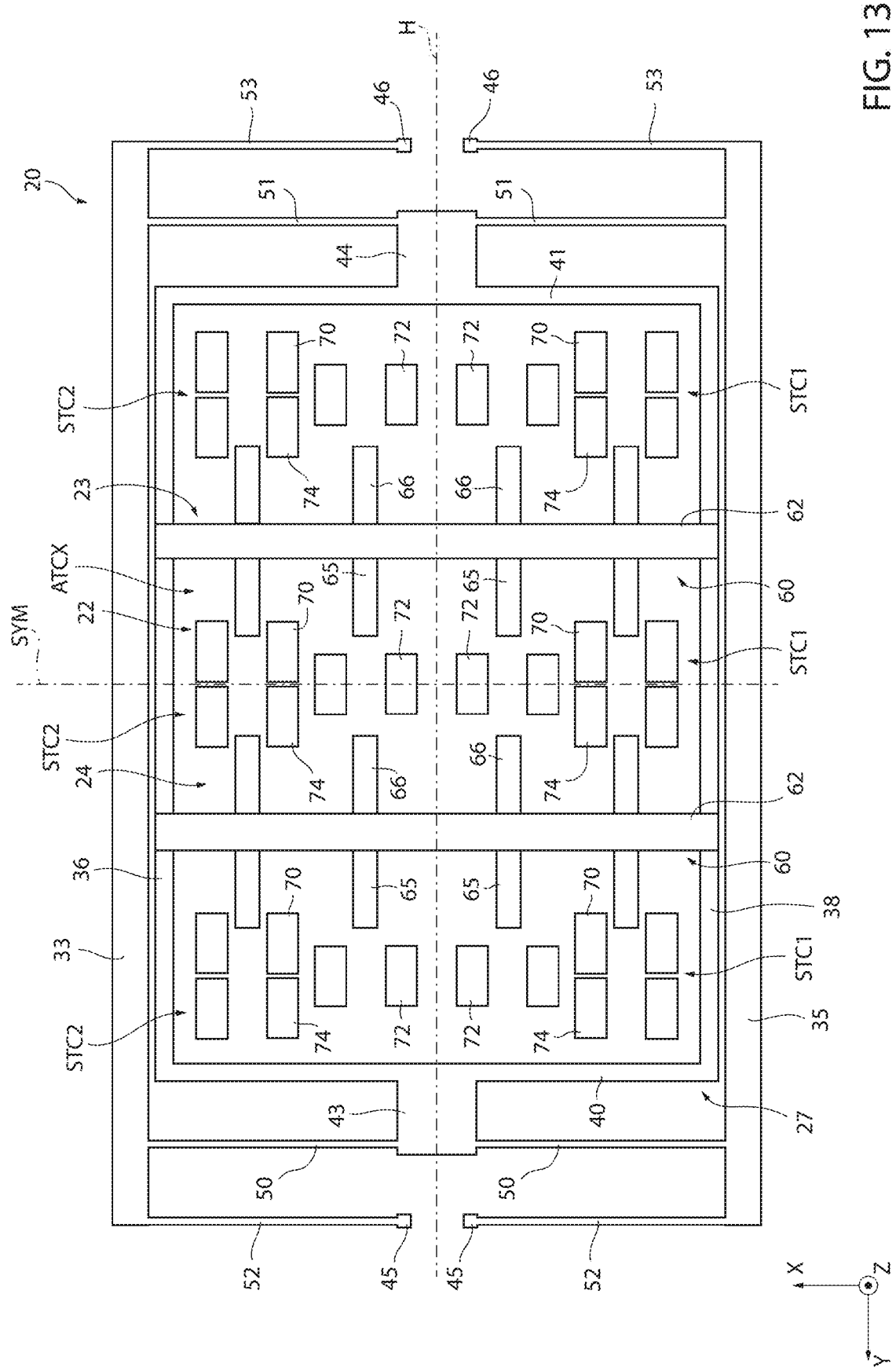
FIG. 13 schematically shows a top view with portions removed of a further embodiment of the present MEMS actuator, in rest conditions.

FIG. 13 instead shows an embodiment wherein the internal frame 27 may move bidirectionally, i.e., may move both in a direction concordant with the Y axis, and in an opposite direction.

In detail, for each transverse region 60 (two shown in FIG. 13), each rotor region 64 comprises a respective rear protruding part 66, which protrudes with respect to the overlying connection region 63, in the opposite direction with respect to the Y axis.

Without any loss of generality, each rear protruding part 66 is symmetrical with respect to a corresponding front protruding part 65. Moreover, considering the first and the second stator cells STC1, STC2 extending between a pair of adjacent transverse regions 60, the rear protruding parts 66 of the transverse region 60 arranged downstream (with respect to the Y axis) form, together with the first and the second stator cells STC1, STC2 and with the front protruding parts 65 of the transverse region 60 arranged upstream (with respect to the Y axis), a symmetrical actuation cell ATCX, which is symmetrical both with respect to the axis of symmetry H and to a transverse symmetry axis SYM, which is perpendicular with respect to the axis of symmetry H. In other words, in rest conditions, the rear protruding parts 66 of the transverse region 60 arranged downstream are symmetrical to the front protruding parts 65 of the transverse region 60 arranged upstream, with respect to the set formed by the first and the second stator cells STC1, STC2.

In this manner, by biasing the first, the second and the third stator regions 70, 72, 74 as described with reference to FIGS. 8A-8D, the internal frame 27 moves in the same manner. Conversely, by reversing the order in which the first, the second and the third stator regions 70, 72, 74 are biased, the internal frame 27 moves in the opposite direction. In fact, in this case it is the rear protruding parts 66 that experience the electrostatic forces caused by the bias, in succession, of the third stator regions 74, the second stator regions 72 and the first stator regions 70.

Without any loss of generality, the embodiment shown in FIG. 13 also comprises a first and a second stator region STC1, STC2 arranged upstream (with respect to the Y axis) of the transverse region 60 arranged further upstream.

The advantages that the present MEMS actuator affords are clear from the previous description.

In particular, the present MEMS actuator allows to increase the stroke, i.e., the displacements of the shuttle, with reduced sizes and with high stability towards the electrostatic pull-in phenomenon. In particular, the length of the stroke is not limited by the length of the rotor regions. From another point of view, the proposed geometry allows the superimposition area between the shuttle (i.e., the internal frame) and the stator regions to be minimized.

Moreover, the MEMS actuator may be obtained by using technological manufacturing processes of a per se known type, such as for example those described in patent application EP 3912953 dated May 19, 2021 in the name of the Applicant, which allow the first and the second epitaxial layers 31, 32 to be patterned so as to obtain the embodiments described.

Finally, it is clear that modifications and variations may be made to the MEMS actuator described and illustrated herein without thereby departing from the scope of the present disclosure, as defined in the attached claims.

Figure 14:
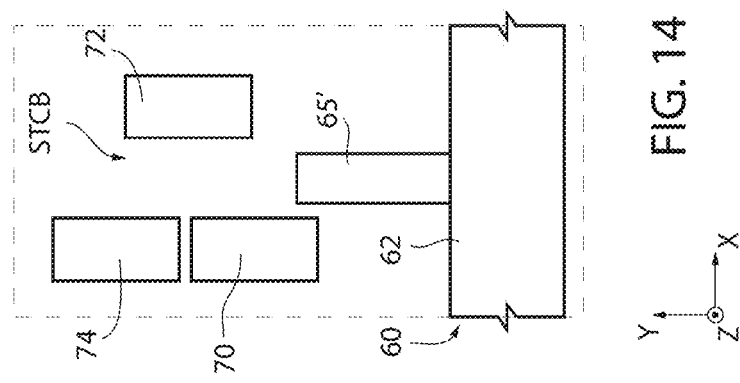
FIGS. 12 and 14 schematically show top views with portions removed of further actuation cells of the MEMS actuator, in rest conditions.

In particular, as previously mentioned, the third stator regions 74 may be absent. Moreover, embodiments are possible wherein, for each transverse region 60, even just one base stator cell STCB, shown in FIG. 14, is present which is equal to the balanced stator cell $STC_e$ shown in FIG. 10, but includes, in addition to the second stator region 72, only a first stator region 70 and a third stator region 74 (optional), aligned with each other parallel to the Y axis.

The base stator cell STCB is therefore coupled operationally with the sole first front protruding part 65'. Since electrostatic forces with non-zero components along the X axis, which risk making the first front protruding part 65' contact the stator regions, act on the first front protruding part 65', the voltage $V_d$ which is applied alternately to the first, the second or the third stator regions 70, 72, 74 needs to be more limited with respect to what occurs in the other embodiments and/or the first front protruding part 65' needs to be more spaced laterally, along the X axis, with respect to the first, the second and the third stator regions 70, 72, 74, unless a corresponding cell, symmetrical with respect to the base stator cell STCB, is also present.

In general, it is also possible that number, shape and arrangement of the rotor regions 64 and of the first, the second and the third stator regions 70, 72, 74 are different with respect to what has been described. The shapes of the internal frame 27 and/or of the external frame 25, as well as of the first and the second deformable structures 55, 57, are also different with respect to what has been described; for example, the internal frame 27, the external frame 25 and the first and the second deformable structures 55, 57 may be formed in whole or partly by the second epitaxial layer 32.

Again with reference to the external frame 25, it is optional, i.e., the internal frame 27 may be coupled directly to the substrate 21 by one or more deformable structures. However, the external frame 25 described allows the stiffness along the X axis to be increased.

In addition, although the driving of the MEMS actuator 20 has been described with reference to direct voltages ("quasi-static" driving), the MEMS actuator 20 may also be driven in conditions proximate to resonance, so as to further increase the stroke or reduce the actuation voltages.

Finally, the biasing of the first, second and third stator regions and the rotor regions may occur in a per se known manner, as an example through corresponding electrodes. As an example, as qualitatively shown in FIG. 4 (but the same considerations apply also to the other embodiments), it is possible for the first stator regions 72 to be electrically connected to a first electrode 370 (as an example, of a metallic material), as an example through corresponding conductive paths (not shown, formed as an example by polysilicon), which extend in the substrate 21, as an example parallel to the X axis; in the same way, the second and third stator regions 72, 74 may be electrically connected, respectively, to a second and a third electrodes 372, 374, through corresponding conductive paths (not shown). Without any loss of generality, the first, second and third electrodes 370, 372, 374 may extend, as an example, under a lower surface Sb that delimits the substrate 21 at bottom. Also the rotor regions 64 may be biased through a rotor electrode 364, which is shown in dotted line in FIG. 3; though not shown in detail, the rotor electrode 364 may be arranged under the lower surface Sb of the substrate 21 and may be electrically connected, through corresponding conductive paths (not shown), to the first and/or second pillar regions 45, 46. In this way, the rotor electrode 364 is in electric contact with the front protruding parts 65 of the rotor regions 64.

A MEMS actuator (20) may be summarized as including a substrate (21); a first semiconductive layer (31) extending on top of the substrate (21); a second semiconductive layer (32) extending on top of the first semiconductive layer (31); a frame (27) including a number of transverse regions (62), which are formed by the second semiconductive layer (32), are elongated parallel to a first direction (X) and are offset along a second direction (Y); and a deformable structure (25,55,57), which is formed by at least one of the first and the second semiconductive layers (31,32) and mechanically couples the frame (27) to the substrate (21), so that the frame (27) is movable with respect to the substrate (21) parallel to the second direction (Y); said MEMS actuator (20) further including, for each transverse region (62): a plurality of corresponding front rotor regions (65), which are formed by the first semiconductive layer (31), are fixed to the transverse region (62) so as to be laterally offset along the transverse region (62) and suspended above the substrate (21), said front rotor regions (65) protruding with respect to the transverse region (62), parallel to the second direction (Y); at least one respective first stator cell (STC1; STC$_e$) including at least one first stator region (70) and one second stator region (72), which are formed by the first semiconductive layer (31) and are fixed to the substrate (21) in such a way that, along the second direction (Y), the second stator region (72) is arranged downstream of the first stator region (70), the first and the second stator regions (70,72) being further laterally offset along the first direction (X) so as to be partially facing; and wherein said first and second stator regions (70,72) are further arranged in such a way that, when the frame (27) is in a rest position, the transverse region (62) is laterally offset with respect to the first and the second stator regions (70,72) and at least one first front rotor region (65') of said corresponding front rotor regions (65) at least partially faces the first stator region (70), said first and second stator regions (70,72) being further arranged in such a way that, during a translation of the frame (27) along the second direction (Y) from the rest position, the first front rotor region (65') and/or a second front rotor region (65") of said corresponding front rotor regions (65) at least partially face the second stator region (72), when the transverse region (62) begins to superimpose on the first stator region (70).

The MEMS actuator may be electronically controlled to apply, when the frame (27) is in the rest position, a voltage between the first stator region (70) and the corresponding front rotor regions (65), so as to apply to the first front rotor region (65') a first electrostatic force which drags the frame (27) along the second direction (Y); and before the transverse region (62) begins to superimpose on the first stator region (70), may cancel said voltage between the first stator region (70) and the corresponding front rotor regions (65) and may apply a voltage between the second stator region (72) and the corresponding front rotor regions (65), so as to apply to said first front rotor region (65') and/or to said second front rotor region (65") a second electrostatic force which drags the frame (27) along the second direction (Y).

The first stator cell (STC$_e$) may include a pair of first stator regions (70), which are symmetrical to each other with respect to the second stator region (72); and the first and the second front rotor regions (65',65") may be arranged in such a way that, during the translation of the frame (27) along the second direction (Y), the first front rotor region (65') moves partly between the second stator region (72) and a stator region of said pair of first stator regions (70), and the second front rotor region (65") moves partly between the second stator region (72) and the other stator region of said pair of first stator regions (70).

The first stator cell (STC$_e$) may further include a pair of third stator regions (74), which are formed by the first semiconductive layer (31), are fixed to the substrate (21) and are respectively aligned, parallel to the second direction (Y), with the pair of first stator regions (70), said third stator regions (74) being further arranged, along the second direction (Y), downstream of the second stator region (72) and being symmetrical to each other with respect to the second stator region (72), said third stator regions (74) partially facing the second stator region (72), in such a way that, during the translation of the frame (27) along the second direction (Y), each of the first and the second front rotor region (65', 65") at least partly faces a respective stator region of said pair of third stator regions (74), when the transverse region (62) begins to superimpose on the second stator region (72). The first stator cell (STC1) may include a pair of first stator regions (70), which are symmetrical with respect to a corresponding direction parallel to the second direction (Y) and are configured to be biased to a same voltage; a pair of second stator regions (72), which are symmetrical with respect to a corresponding direction parallel to the second direction (Y) and are configured to be biased to a same voltage, said pair of second stator regions being laterally offset with respect to the pair of first stator regions (70) along the first and the second directions (X,Y); and the pair of first stator regions (70) and the pair of second stator regions (72) may be arranged in such a way that, during the translation of the frame (27) along the second direction (Y) from the rest position, the first front rotor region (65') moves partly between the first stator regions (70) and the second front rotor region (65") moves partly between the second stator regions (72).

The pair of first stator regions (70) and the pair of second stator regions (72) may be arranged in such a way that, during the translation of the frame (27) along the second direction (Y), a third front rotor region (65''') of said corresponding front rotor regions (65) moves partly between the pair of first stator regions (70) and the pair of second stator regions (72).

The first stator cell (STC1) may further include a pair of third stator regions (74), which are formed by the first semiconductive layer (31), are fixed to the substrate (21), are symmetrical with respect to a corresponding direction parallel to the second direction (Y) and are configured to be biased to a same voltage, the third stator regions (74) being further respectively aligned, parallel to the second direction (Y), with the first stator regions (70), the pair of third stator regions (74) being further arranged, along the second direction (Y), downstream of the pair of second stator regions (72), so that one of said third stator regions (74) partly faces one of said second stator regions (72), said pair of third stator regions (74) being further arranged in such a way that, during the translation of the frame (27) along the second direction (Y), the first front rotor region (65') is at least partially interposed between the third stator regions (74), when the transverse region (62) begins to superimpose on the second stator regions (72).

The MEMS actuator may include, for each transverse region (62), at least one second stator cell (STC2), which is offset, along the first direction (X), with respect to the corresponding first stator cell (STC1) and is symmetrical with respect to the corresponding first stator cell (STC1).

The MEMS actuator may further include, for each transverse region (62) a plurality of corresponding rear rotor regions (66), which are formed by the first semiconductive layer (31), are fixed to the transverse region (62), are symmetrical with respect to the corresponding front rotor regions (65) and protrude with respect to the transverse region (62), in the opposite direction with respect to the second direction (Y); and, when the frame (27) is in the rest position, the front rotor regions (65) of a first transverse region (62) and the rear rotor regions (66) of a second transverse region (62) may be symmetrical, with respect to the first stator cell (STC1,STC2) of the first transverse region (62).

The front rotor regions (65) may be equal to each other.

The deformable structure (25,55,57) may be compliant parallel to the second direction (Y).

The front rotor regions (65) may be in electrical contact with the respective transverse region (62).

A system may be summarized as including the MEMS actuator (20) and an electronic control device (101), which is electronically coupled to the MEMS actuator (20) and is configured to apply, when the frame (27) is in the rest position, a voltage between the first stator region (70) and the corresponding front rotor regions (65), so as to apply to the first front rotor region (65') a first electrostatic force which drags the frame (27) along the second direction (Y); before the transverse region (62) begins to superimpose on the first stator region (70), cancel said voltage between the first stator region (70) and the corresponding front rotor regions (65) and apply a voltage between the second stator region (72) and the corresponding front rotor regions (65), so as to apply to said first front rotor region (65') and/or to said second rotor region (65") a second electrostatic force which drags the frame (27) along the second direction (Y).

The MEMS actuator (20) may include a sensing structure (99) configured to generate an electrical signal indicative of the position of the frame (27) along the second direction (Y); and wherein the electronic control device (101) is configured to apply and cancel said voltage between the first stator region (70) and the corresponding front rotor regions (65) and to apply said voltage between the second stator region (72) and the corresponding front rotor regions (65) as a function of said electrical signal.

A method for controlling the MEMS actuator (20), may be summarized as including applying, when the frame (27) is in the rest position, a voltage between the first stator region (70) and the corresponding front rotor regions (65), so as to apply to the first front rotor region (65') a first electrostatic force which drags the frame (27) along the second direction (Y); and before the transverse region (62) begins to superimpose on the first stator region (70), cancelling said voltage between the first stator region (70) and the corresponding front rotor regions (65) and applying a voltage between the second stator region (72) and the corresponding front rotor regions (65), so as to apply to said first front rotor region (65') and/or to said second rotor region (65") a second electrostatic force which drags the frame (27) along the second direction (Y).

The various embodiments described above can be combined to provide further embodiments. Aspects of the embodiments can be modified, if necessary to employ concepts of the various patents, applications and publications to provide yet further embodiments.

These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A microelectromechanical system (MEMS) actuator comprising:
   a substrate;
   a first semiconductive layer extending on top of the substrate;
   a second semiconductive layer extending on top of the first semiconductive layer;
   a frame comprising a number of transverse regions, which are formed by the second semiconductive layer, are elongated parallel to a first direction and are offset along a second direction; and
   a deformable structure, which is formed by at least one of the first and the second semiconductive layers and mechanically couples the frame to the substrate, so that the frame is movable with respect to the substrate parallel to the second direction;
   said MEMS actuator further comprising, for each transverse region:
   a plurality of corresponding front rotor regions, which are formed by the first semiconductive layer, are fixed to the transverse region so as to be laterally offset along the transverse region and suspended above the substrate, said front rotor regions protruding with respect to the transverse region, parallel to the second direction;
   at least one respective first stator cell including at least one first stator region and one second stator region, which are formed by the first semiconductive layer and are fixed to the substrate in such a way that, along the second direction, the second stator region is arranged downstream of the first stator region, the first and the second stator regions being further laterally offset along the first direction so as to be partially facing;
   and wherein said first and second stator regions are further arranged in such a way that, when the frame is in a rest position, the transverse region is laterally offset with respect to the first and the second stator regions and at least one first front rotor region of said corresponding front rotor regions at least partially faces the first stator region, said first and second stator regions being further arranged in such a way that, during a translation of the frame along the second direction from the rest position, at least one of the following of the first front rotor region and a second front rotor region of said corresponding front rotor regions at least partially face the second stator region, when the transverse region begins to superimpose on the first stator region.

2. The MEMS actuator according to claim 1, further comprising:
   a first stator electrode and a second stator electrode, the first and second stator electrodes are electrically coupled to, respectively, the first and second stator regions; and
   a rotor electrode that is electrically coupled to the first and second front rotor regions.

3. The MEMS actuator according to claim 1, which may be electronically controlled to:
   apply, when the frame is in the rest position, a voltage between the first stator region and the corresponding front rotor regions, so as to apply to the first front rotor region a first electrostatic force which drags the frame along the second direction; and
   before the transverse region begins to superimpose on the first stator region, cancel said voltage between the first stator region and the corresponding front rotor regions and apply a voltage between the second stator region and the corresponding front rotor regions, so as to apply to at least one of the following of said first front rotor region and to said second front rotor region a second electrostatic force which drags the frame along the second direction.

4. The MEMS actuator according to claim 1, wherein the first stator cell comprises a pair of first stator regions, which are symmetrical to each other with respect to the second stator region; and wherein the first and the second front rotor regions are arranged in such a way that, during the translation of the frame along the second direction, the first front rotor region moves partly between the second stator region and a stator region of said pair of first stator regions, and the second front rotor region moves partly between the second stator region and the other stator region of said pair of first stator regions.

5. The MEMS actuator according to claim 4, wherein the first stator cell further comprises a pair of third stator regions, which are formed by the first semiconductive layer, are fixed to the substrate and are respectively aligned, parallel to the second direction, with the pair of first stator regions, said third stator regions being further arranged, along the second direction, downstream of the second stator region and being symmetrical to each other with respect to the second stator region, said third stator regions partially facing the second stator region, in such a way that, during the translation of the frame along the second direction, each of the first and the second front rotor region at least partly faces a respective stator region of said pair of third stator regions, when the transverse region begins to superimpose on the second stator region.

6. The MEMS actuator according to claim 1, wherein the first stator cell comprises:
a pair of first stator regions, which are symmetrical with respect to a corresponding direction parallel to the second direction and are configured to be biased to a same voltage;
a pair of second stator regions, which are symmetrical with respect to a corresponding direction parallel to the second direction and are configured to be biased to a same voltage, said pair of second stator regions being laterally offset with respect to the pair of first stator regions along the first and the second directions;
and wherein the pair of first stator regions and the pair of second stator regions are arranged in such a way that, during the translation of the frame along the second direction from the rest position, the first front rotor region moves partly between the first stator regions and the second front rotor region moves partly between the second stator regions.

7. The MEMS actuator according to claim 6, wherein the pair of first stator regions and the pair of second stator regions are arranged in such a way that, during the translation of the frame along the second direction, a third front rotor region of said corresponding front rotor regions moves partly between the pair of first stator regions and the pair of second stator regions.

8. The MEMS actuator according to claim 6, wherein the first stator cell further comprises a pair of third stator regions, which are formed by the first semiconductive layer, are fixed to the substrate, are symmetrical with respect to a corresponding direction parallel to the second direction and are configured to be biased to a same voltage, the third stator regions being further respectively aligned, parallel to the second direction, with the first stator regions, the pair of third stator regions being further arranged, along the second direction, downstream of the pair of second stator regions, so that one of said third stator regions partly faces one of said second stator regions, said pair of third stator regions being further arranged in such a way that, during the translation of the frame along the second direction, the first front rotor region is at least partially interposed between the third stator regions, when the transverse region begins to superimpose on the second stator regions.

9. The MEMS actuator according to claim 6, which comprises, for each transverse region, at least one second stator cell, which is offset, along the first direction, with respect to the corresponding first stator cell and is symmetrical with respect to the corresponding first stator cell.

10. The MEMS actuator according to claim 1, further comprising, for each transverse region:
a plurality of corresponding rear rotor regions, which are formed by the first semiconductive layer, are fixed to the transverse region, are symmetrical with respect to the corresponding front rotor regions and protrude with respect to the transverse region, in the opposite direction with respect to the second direction;
and wherein, when the frame is in the rest position, the front rotor regions of a first transverse region and the rear rotor regions of a second transverse region are symmetrical, with respect to the first stator cell of the first transverse region.

11. The MEMS actuator according to claim 3, wherein the front rotor regions are equal to each other.

12. The MEMS actuator according to claim 3, wherein the deformable structure is compliant parallel to the second direction.

13. The MEMS actuator according to claim 3, wherein the front rotor regions are in electrical contact with the respective transverse region.

14. A microelectromechanical system (MEMS) actuator, comprising:
a substrate;
an internal frame suspended over the substrate, the internal frame includes:
a frame portion including:
a first portion;
a second portion opposite to the first portion; and
a third portion transverse to the first and second portions and extending from the first portion to the second portion;
a transverse region that extends from the first portion to the second portion, the transverse region is spaced apart from the third portion of the frame, the transverse region includes:
a bridge region that extends from the first portion to the second portion; and
a first rotor region that protrudes from the bridge region in a first direction towards the substrate and a second direction towards the third portion, the first direction being transverse to the second direction; and
a second rotor region that protrude from the bridge region in the first direction towards the substrate and the second direction towards the third portion, the second rotor region being offset and spaced apart from the first rotor region.

15. The MEMS actuator of claim 14, wherein the internal frame further includes a coupling region extending outward from the third portion and away from the first and second portions of the frame portion, and the coupling region is spaced apart from the transverse region.

16. The MEMS actuator of claim 15, further comprising:
an external frame spaced outward from the internal frame, the external frames suspend over the substrate;
an anchor coupled to the substrate;
a first spring coupled to the anchor and coupled to the external frame; and
a second spring coupled to the coupling region of the internal frame and coupled to the external frame.

17. The MEMS actuator according to claim 14, further comprising:
a first stator region protruding from the substrate, the first stator region being between the first rotor region and the second rotor region, and the first stator region being offset from the first rotor region and the second rotor region;

a second stator region protruding from the substrate, the second stator region being between the first rotor region and the second rotor region, the second stator region being offset the first rotor region, the second rotor region, and the first stator region; and a third stator region protruding from the substrate, the third stator region being between the first rotor region and the second rotor region, the third stator region being offset the first rotor region, the second rotor region, and the second stator region, and the third stator region being aligned with the first stator region.

18. The MEMS actuator according to claim 17, wherein:
the second stator region is downstream the first stator region in the second direction; and
the third stator region is downstream the first stator region and the second stator region in the second direction.

19. The MEMS actuator according to claim 14, further comprising:
a first stator region protruding from the substrate and the first stator region being offset from the first rotor region and the second rotor region;
a second stator region protruding from the substrate, the second stator region being offset the first rotor region, the second rotor region, and the first stator region, the second stator region being downstream from the first stator region in the second direction; and
a third stator region protruding from the substrate, the third stator region being offset the first rotor region, the second rotor region, and the second stator region, the third stator region being aligned with the first stator region, and the third stator region being downstream the first stator region and the second stator region in the second direction.

20. A system, comprising:
a micro-electro-mechanical system (MEMS) actuator including:
a substrate;
a plurality of stator regions protrude from the substrate;
an internal frame suspended over the substrate, the internal frame includes:
a frame portion including:
a first portion;
a second portion opposite to the first portion; and
a third portion transverse to the first and second portions and extending from the first portion to the second portion;
a transverse region that extends from the first portion to the second portion, the transverse region is spaced apart from the third portion of the frame, the transverse region includes:
a bridge region that extends from the first portion to the second portion; and
a first rotor region that protrudes from the bridge region in a first direction towards the substrate and a second direction towards the third portion, the first direction being transverse to the second direction; and
a second rotor region that protrude from the bridge region in the first direction towards the substrate and the second direction towards the third portion, the second rotor region being offset and spaced apart from the first rotor region;
an electronic control device coupled to the MEMS actuator, the electronic controller configured to, in operation, bias the plurality of stator regions translating the internal frame away from a rest position towards a translated position.

21. The system according to claim 20, wherein the plurality of stator regions includes:
a first stator region being offset from the first rotor region and the second rotor region;
a second stator region being offset the first rotor region, the second rotor region, and the first stator region, the second stator region being downstream from the first stator region in the second direction; and
a third stator region being offset the first rotor region, the second rotor region, and the second stator region, the third stator region being aligned with the first stator region, and the third stator region being downstream the first stator region and the second stator region in the second direction.

* * * * *